United States Patent
Kato

(10) Patent No.: US 6,862,237 B2
(45) Date of Patent: Mar. 1, 2005

(54) DATA ACCESS METHOD OF SEMICONDUCTOR MEMORY DEVICE AND SEMICONDUCTOR MEMORY DEVICE

(75) Inventor: Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 85 days.

(21) Appl. No.: 10/261,951

(22) Filed: Oct. 2, 2002

(65) Prior Publication Data

US 2003/0123298 A1 Jul. 3, 2003

(30) Foreign Application Priority Data

Dec. 27, 2001 (JP) ......................................... 2001-396711

(51) Int. Cl.[7] .................................................. G11C 7/00
(52) U.S. Cl. ......................... 365/222; 365/194; 365/196
(58) Field of Search .......................... 356/222; 365/233, 365/194, 195, 196, 189.04, 222

(56) References Cited

U.S. PATENT DOCUMENTS

| | | | | |
|---|---|---|---|---|
| 4,907,199 A | * | 3/1990 | Dosaka et al. | ......... 365/189.04 |
| 5,748,547 A | | 5/1998 | Shau | |
| 5,936,897 A | | 8/1999 | Koga | |
| 6,028,804 A | | 2/2000 | Leung | |
| 6,075,740 A | | 6/2000 | Leung | |
| 6,504,780 B2 | * | 1/2003 | Leung | ......................... 365/222 |
| 6,545,943 B2 | * | 4/2003 | Mizugaki et al. | ......... 365/233.5 |
| 6,646,943 B2 | * | 11/2003 | Kim | ............................. 365/222 |
| 2001/0026493 A1 | | 10/2001 | Leung | |

FOREIGN PATENT DOCUMENTS

| | | |
|---|---|---|
| EP | 0 326 183 A2 | 8/1989 |
| EP | 06027104 | 2/1994 |
| JP | 05-258562 | 10/1993 |
| JP | 2001-283586 | 10/2001 |

OTHER PUBLICATIONS

European Search Report with Annex (EP 02 25 7009).

* cited by examiner

Primary Examiner—Richard Elms
Assistant Examiner—Toan Le
(74) Attorney, Agent, or Firm—Arent Fox, PLLC

(57) ABSTRACT

In the case that a refresh operation is carried out which is independent from an external access operation, both a data access method of a semiconductor memory device, and a semiconductor memory device are provided by which time suitable of each of these external access operation and refresh operation is set. While a time-measuring start signal "SIN" is entered into a path switching means, the path switching means is connected to either a first timer section or a second timer section under control of an external-access-operation-start-request signal REQ(O) and a refresh-operation-start-request signal REQ(I). Both the first and second timer sections measure both time "τO" and time "τI" to output a time-measuring stop signal "SOUT." The measuring time "τO" corresponds to differential amplification time of a bit line pair when the external access operation is carried out, whereas the measuring time "τI" corresponds to differential amplification time when the refresh operation is carried out. Alternatively, the measuring time "τO" may be varied by reading/writing operations so as to be set. As a consequence, proper amplification time can be set every operation mode.

23 Claims, 15 Drawing Sheets

CIRCUIT BLOCK DIAGRAM FOR INDICATING DATA INPUT/OUTPUT PATH TO WHICH PRESENT INVENTION IS APPLIED

FIRST PRINCIPLE OF PRESENT INVENTION

SECOND PRINCIPLE OF PRESENT INVENTION

FIG. 3 CIRCUIT BLOCK DIAGRAM FOR INDICATING DATA INPUT/OUTPUT PATH TO WHICH PRESENT INVENTION IS APPLIED

DEACTIVATION TIMING VARIABLE CIRCUIT ACCORDING TO FIRST EMBODIMENT

SPECIFIC EXAMPLE OF FIRST EMBODIMENT

DEACTIVATION-TIMING VARIABLE CIRCUIT ACCORDING TO SECOND EMBODIMENT

SPECIFIC EXAMPLE OF SECOND EMBODIMENT

FIG. 8 DEACTIVATION-TIMING VARIABLE CIRCUIT ACCORDING TO THIRD EMBODIMENT

FIG. 9 SPECIFIC EXAMPLE OF THIRD EMBODIMENT

FIG. 10 OPERATIONS OF BURST LENGTH (1) IN SYNCHRONOUS TYPE SEMICONDUCTOR MEMORY DEVICE

FIG. 11 IN CASE REFRESH OPERATION IS EMBEDDED IN OPERATIONS OF BURST LENGTH (1)
(FOURTH EMBODIMENT)

FIG. 12  OPERATIONS OF MULTIPLE BURST LENGTH (8) IN SYNCHRONOUS TYPE SEMICONDUCTOR MEMORY DEVICE

FIG. 13 IN CASE REFRESH OPERATION IS EMBEDDED IN OPERATIONS OF MULTIPLE BURST LENGTH (FIFTH EMBODIMENT)

EXTENSION OF CYCLE TIME IN REFRESH OPERATION OF PRIOR ART

PERIOD OF (ORDINARY OPERATION), (SELF-REFRESH OPERATION) OR (CBR REFRESH OPERATION)

REFRESH OPERATION EXECUTED IN PSEUDO-SRAM OF PRIOR ART

COMPARISONS OF BIT LINE PAIR AMPLIFYING OPERATION IN RESPECTIVE OPERATION MODES

CIRCUIT BLOCK DIAGRAM FOR INDICATING DATA INPUT/OUTPUT PATH OF PRIOR ART

DATA ACCESS METHOD OF SEMICONDUCTOR MEMORY DEVICE AND SEMICONDUCTOR MEMORY DEVICE

BACKGROUND OF THE INVENTION

1. Field of the Invention

The present invention is generally related to a data access method of a semiconductor memory device in the case that a refresh operation is executed as an internal access operation which is independently carried out with respect to an external access operation, and also related to a semiconductor memory device. More specifically, the present invention is directed to a data access method of a semiconductor memory device, capable of effectively executing a refresh operation during an external access operation, or between successive external access operations, and also directed to a semiconductor device.

2. Description of Related Art

In volatile semiconductor memory devices which are typically known as dynamic random access memories (will be referred to as "DRAMs" hereinafter), refresh operations must be regularly carried out in order to maintain data stored in memory cells.

FIG. 14 indicates operating waveforms as to a so-called "self-refresh operation", namely, a refresh operation which is automatically carried out every predetermined time period under stand-by state among general-purpose refresh operations in prior art. Symbol (I) of FIG. 14 shows a control operation executed in the case of an asynchronous type DRAM. In this control operation, for instance, a self-refresh operation is carried out in a CAS before RAS (will be referred to as a "CBR" hereinafter) refresh operation. As to an external control signal "/RAS" and another external control signal "/CAS", a self-refresh operation is controlled in accordance with a signal transition sequence which is reversed with respect to the normal access operation. That is, the external control signal "/CAS" is transferred to a negative logic level before the external control signal "/RAS" is transferred to a negative logic level. The condition of the self-refresh operation is maintained under such a condition that both the external control signals "/RAS" and "/CAS" are at the negative logic levels. Also, symbol (II) of FIG. 14 shows a control operation executed in the case of a synchronous type DRAM (will be referred to as an "SDRAM" hereinafter). In this SDRAM control operation, a self-refresh operation is carried out by entering a command in synchronism with a clock signal "CLK." The self-refresh operation is commenced in response to a start command "REF" of the refresh operation, and thereafter, the self-refresh condition is maintained. The self-refresh condition is ended in response to another command "EXIT."

Within a time period of a self-refresh operation, an external access operation (for example, data is read/written) is not carried out (see symbol "III" of FIG. 14), but a refresh operation corresponding to an internal access operation is continued. Are fresh execution signal is outputted based upon a refresh-operation-start-request signal "REQ (I)" outputted in a predetermined refreshing time period, and thus, a refresh operation is sequentially carried out with respect to memory cell groups which are connected to word lines having predetermined addresses. FIG. 14 shows that word lines defined from an address "#0" up to an address "#N" are sequentially selected.

Within a self-refresh time period during which an external access operation (for example, data is read/written) is not executed, a refresh operation is intermittently carried out every predetermined time period. Conventionally, under such a circumstance, since a cycle time in a refresh operation is extended so as to improve a restore level of data into a memory cell, a refresh time period is prolonged, so that a current consumed during a self-refresh time period is tried to be reduced.

For instance, in such a semiconductor memory device described in Japanese Laid-Open Patent Publication No. 5-258562, this semiconductor memory device owns the self-refresh function capable of automatically and internally refreshing the memory cells. The semiconductor memory device to which time out is set is constituted by the time-out-initiating means (RAS), the time-out-terminating means ($\phi$SA), and also, the means for delaying the termination of the time out based upon the signal ($\phi$S) indicative of the self-refresh mode. As a result, upon receipt of the signal ($\phi$S) indicative of the self-refresh mode, the termination of the active time out may be delayed, as compared with that of the normal operation.

Also, as to such a semiconductor memory circuit disclosed in Japanese Laid-Open Patent Publication No. 2001-283586, the semiconductor memory circuit equipped with the refresh function used to restore the data held in the memory cell is constituted by employing the circuit system for switching the delay amounts of the signals in such a manner that while the CBR refresh time is defined as the reference time, the signal for defining the deactivation of the word line during the self-refresh time is delayed. As a result, while the semiconductor memory circuit owns the circuit system capable of switching the signal path for resetting the internal ROW-system signal in the self-refresh operation and the CBR refresh operation, the tRAS-time period is prolonged and the restore level is secured during the self-refresh operation.

In these measures, as indicated in FIG. 15, the cycle time during the self-refresh operation is extended, as compared with the time in either the normal operation or the CBR refresh operation in order to increase the amplification level of the bit line pair (namely, both "BL" and "/BL"), so that the restore level to the memory cell may be improved.

The above-described measures are executed so as to achieve an object of lowering of the current consumption during the self-refresh time period. In such a self-refresh time period, since an external access operation is not executed, high-speed operation is not required as to cycle time and access time. As a result, the above-described object may be achieved by conversely extending cycle time during a refresh operation.

On the other hand, very recently, as a result of such a fact that since portable appliances are popularized, functions required for these portable appliances are increased, semiconductor memory devices having larger memory capacities have been required instead of static random access memories (will be referred to as "SRAMs" hereinafter) which have been conventionally mounted on these portable appliances. Due to such a necessity that these semiconductor memory devices having the larger memory capacities should be packaged with limited spaces with realistic prices while using DRAM type memory cells having high integration and lower bit unit cost instead of SRAM type memory cells, DRAMs containing refresh functions have been utilized. These DRAMs are so-called "pseudo-SRAMs" which contain control operation related to such refresh operations specific to memory cells of DRAMs. Also, in response to future requirements as to high-speed memory operations, a so-termed "pseudo-SSRAM" technical idea may be realized, while this pseudo-SSRAM technical specification may be suitable to an external technical specification of a synchronous type SRAM (will be referred to as an "SSRAM" hereinafter).

Since either a pseudo-SRAM or a pseudo-SSRAM may own compatibility with respect to either an SRAM or an SSRAM in view of circuit operations thereof, in either the pseudo-SRAM or the pseudo-SSRAM, a refresh operation may be automatically carried out in arbitrary timing if necessary. As a consequence, both a refresh operation corresponding to an internal access operation, and normal read/write operations corresponding to an external access operation are independently carried out at arbitrary timing.

FIG. 16 shows conditions as to both an external access operation and a refresh operation of a pseudo-SRAM in the conventional technique. It should be understood that the refresh operation corresponding to the internal access operation is carried out independent from read/write operations corresponding to the external access operation. Symbol (I) of FIG. 16 shows a refresh cycle. With respect to a refresh-operation-start-request signal REQ (I), a refresh execution signal is outputted, so that a refresh operation is executed with respect to the address #0. Symbol (II) of FIG. 16 represents an external access cycle. In response to an external-operation-start-request signal REQ (O), an external access operation is carried out.

Symbol (III) of FIG. 16 represents such a case that the external-access-operation-start-request signal REQ (O) is in competition with the refresh-operation-start-request signal REQ (I). In this case, an adjustment between the external access operation, and the refresh operation is required. An access competition (1) corresponds to such a case that the refresh-operation-start-request signal REQ (I) is detected prior to the external-operation-start-request signal REQ (O). As to operation sequence in this case, the refresh operation for the address #1 is executed at a top priority, and subsequently, the external access operation is executed. A cycle time "tCE" is defined by both the refresh operation and the external access operation. An access competition (2) corresponds to such a case that the external-operation-start-request signal REQ (O) is detected prior to the refresh operation-start-request signal REQ (I). As to operation sequence in this case, the external access operation is executed at a top priority, and subsequently, the refresh operation for the address #2 is executed. A cycle time tCE is defined by both the refresh operation and the external access operation. An access competition (3) corresponds to such a case that both the refresh-operation-start-request signal REQ (I) and the external-operation-start-request signal REQ (O) are detected at the same time. The operation sequence of this case depends upon a control operation of a semiconductor memory device. However, generally speaking, such a control operation is carried out. That is, it is a top priority to avoid that data disappears by executing the refresh operation prior to the external access operation. Thus, the refresh operation for the address #3 is executed at a top priority, and subsequently, the external access operation is executed. A cycle time "tCE" is defined by both the refresh operation and the external access operation.

FIG. 17 indicates both input/output operations of data in an external access operation, and a differential amplification operation of a bit line pair ("BL" and "/BL") in data restore operation in a refresh operation. As to each of operations when a refresh operation is performed (symbol (A) in FIG. 17), when a read operation is performed (symbol (B) in FIG. 17), and when a write operation is performed (symbol (C) in FIG. 17), FIG. 17 indicates temporal comparisons executed until memory cell data which has been read, or written into the bit line pair ("BL" and "/BL") in conjunction with activation of a word line "WL" is amplified to such a voltage level higher than, or equal to a specified voltage level VH (MIN). It should be noted that as to a complementary bit line "/BL", this level is lower than, or equal to VL (MIN). FIG. 17 shows temporal comparisons defined from activation of a sense amplifies activating signal "φSA" until the bit line pair ("BL" and "/BL") reaches a specified voltage.

Prior to explanations as to FIG. 17, input/output paths of data from memory cells will now be briefly described with reference to FIG. 18. Memory cells "Ta" to "Td" are connected to the respective bit lines "/BL0", "/BL1", "BL0", and "BL1." Since either a word line "WL0" or another word line "WL1" is activated, storage charges which have been stored in these memory cells Ta to Td are again distributed into either the bit lines BL0 and BL1 or the bit lines /BL0 and /BL1. Thereafter, these distributed storage charges are differential-amplified in the bit line pair (BL0 and /BL0) and the bit line pair (BL1 and /BL1) by sense amplifiers "SA0" and "SA1." The differential-amplified data are outputted via either column switches T01 and T02, or column switches T11 and T12 to data lines DB and /DB, and then are amplified by a read amplifier "RA", and thereafter, the data amplified by this read amplifier RA is outputted from an input/output buffer "Buf" (Dout). Conversely, input data "Din" is amplified via the input/output buffer Buf by a write amplifier "WA", and then, this amplified input data "Din" is stored in such a manner that the amplified input data are stored as charges from data lines DB and /DB via either the column switches T01 and T02 or the column switches T11 and T12, and also via either the bit lies BL0 and /BL0 or the bit lines BL1 and /BL1 into memory cells Ta to Td. Also, in the refresh operation, the charges which have been again distributed from the memory cells Ta to Td to either the bit lines BL0 and BL1 or the bit lines /BL0 and /BL1 by activating either the word line WL0 or the word line WL1 are differential-amplified by both the sense amplifiers SA0 and SA1, and thereafter, since either the word line WL0 or the word line WL1 is deactivated, the data is restored. In this case, since no data is inputted and/or outputted from an external circuit, either the column switches T01 and T02 or the column switches T11 and T12 are not brought into conductive states.

The activation of either the word line WL0 or another word line WL1 is carried out by that an activating signal "SET" derived from a row-system-activation control circuit "RCA" which receives an external-access-operation/refresh operation-start-request signal REQ (O)/(I) is entered in to a word decoder "WD." Also, the activating signal SET is also entered into the sense amplifier signal circuit SC which outputs the sense amplifier activating signal φSA. Also, a deactivating signal "RST" which deactivates both the word line WL0 and WL1, and also the sense amplifier activating signal φSA is outputted by a deactivation timing circuit 100 after a predetermined delay time from the activating signal SET.

Also, control signals "ACL" and "/ACL", complementary to each other, are outputted from a column system control circuit CC. The control signal ACL is decoded by the column switch signal circuit CS, and then, the column switch signal circuit CS outputs either a column switch signal "CL0" or another column switch signal "CL1" of either the column switches T01 and T02 or the column switches T11 and T12. On the other hand, while the complementary control signal "/ACL" controls PMOS transistors TP1 and TP2 which connects the data lines DB and /DB with a (½) VCC voltage supply line, the data lines DB and /DB are precharged to a (½) VCC voltage within a time period during which data is not inputted and outputted.

It should also be noted that in FIG. 18, the PMOS transistors TP1 and TP2 corresponding to the precharge elements of the data lines DB and /DB may be operated in another manner. That is to say, the control signal /ACL of the PMOS transistors TP1 and TP2 are continuously activated either during the refresh operation or during the read operation, so that the data line pair (DB and /DB) may be equalized to an arbitrary potential, or voltage amplitudes are limited. During the write operation, this control signal /ACL is deactivated, so that the data line pair (DB and /DB) may be set to the operating voltage of the write amplifier WA. Furthermore, the (½) VCC voltage may be substituted by an arbitrary voltage.

Referring back to FIG. 17, a comparison is made of respective time durations defined from the sense amplifier activating signal φSA until the bit line pair (BL and /BL) becomes the specified voltage levels VH(MIN) and VL(MIN) in the respective operation modes (symbols (A) to (C) shown in FIG. 17). Since the refresh operation (symbol (A) in FIG. 17) is directed to the restore operation with respect to the memory cell, either the column switches T01 and T02 or the column switches T11 and T12 are not brought into conductive states while the amplifying operations by the sense amplifiers SA0 and SA1 are carried out. As a consequence, while the amplifying operations by the sense amplifiers SA0 and SA1 are carried out, the data lines DB and /DB are not connected as loads, but the bit line pair (BL and /BL) is amplified up to the specified voltage for amplification time "of the refresh operation tRef."

Within the read operation (symbol (B) sown in FIG. 17), either the column switches T01 and T02 or the column switches T11 and T12 are brought into conductive states by the column switch signal CL when the amplifying operations of the sense amplifiers SA0 and SA1 are being performed, and thus, read data are outputted to the data lines DB and /DB. At the connection time instant, since the data lines DB and /DB are precharged to the (½) VCC voltage, either the column switches T01 and T02 or the column switches T11 and T12 are brought into the conductive states, so that the bit line pair (BL and /BL) is disturbed thereby, and thus, the differential amplification level is retreated. It should be understood that even after either the column switches T01 and T02 or the column switches T11 and T12 are brought into non-conductive states, since the differential amplifications by the sense amplifiers SA0 and SA1 are continued, the bit line pair (BL and /BL) finally reaches the specified voltages. It should also be noted that since the bit line pair (BL and /BL) is disturbed while the column switches T01 and T02 or the column switches T11 and T12 are brought into the conductive states, the amplification time of the read operation "tRD" is prolonged, as compared with the above-described amplification time of the refresh operation "tRef."

Within the write operation (symbol (C) shown in FIG. 17), either the column switches T01 and T02 or the column switches T11 and T12 are brought into the conductive states by the column switch signal CL when the amplifying operations of the sense amplifiers SA0 and SA1 are being carried out, so that data are written from the data lines DB /DB into the bit lines BL and /BL. In symbol (C) of FIG. 17, there is shown such a case that inverted data are written. In this case, the voltage levels of the bit line pair (BL and /BL), which are differential-amplified up to a half way of the voltage levels, must be inverted. The voltage levels of the bit line pair (BL and /BL) which have been inverted by a write amplifier "WA" and by bringing either the column switches T01 and T02 or the column switches T11 and T12 into the conductive states are differential-amplified by the sense amplifiers SA0 and SA1 even after either the column switches T01 and T02 or the column switches T11 and T12 are brought into the non-conductive states, and then, the differential-amplified levels reach the specified voltages. Since the amplified data must be inverted, amplification time of the write operation "tWT" is prolonged, as compared with the above-described amplification time of the read operation "tRD."

In other words, the external access operation requires the longer amplification time than the amplification time required by the refresh operation. That is, in the refresh operation, only the row system operation is carried out without having the input/output operations of the data, and the amplifying operation is completed while the bit lines BL and /BL are employed as the main loads. In the external access operation, not only the row system operation but also the column system operation are carried out with having the input/output operations of the data, and while the data disturbance, or the data inversion is accepted, the amplifying operation is carried out by employing both the bit lines BL and /BL, and also the data lines DB and /DB as the main loads. A comparison of the amplification time among the respective operation modes is defined as follows: tRef<tRD<tWT. Since the cycle time tCE appeared on the operation is set in such a manner that these amplification time "tRef", "tRD", and "tWT" are fitted into this cycle time, timing involving the amplification time of the write operation tWT is set in the deactivation timing circuit 100, and thus, the cycle time tCE appeared on the operation may be determined.

However, in the prior art, while the longest amplification time "tWT" required when the inverted data is written is employed as the reference time, the deactivating signal RST is produced by the deactivation timing circuit 100. As a result, in the read operation as well as the refresh operation, in which the voltage levels of the bit line pairs (BL and /BL) can be amplified within shorter amplification time than that of the above-explained write operation, such an amplification time longer than the necessary amplification time is secured. In other words, in the read operation, such a time defined by (tWT-tRD) is continuously added even after the differential amplifying operation is accomplished. Also, in the refresh operation, such a time defined by (tWT-tRef) is always added even after the differential-amplifying operation is accomplished.

As a consequence, as to such a case that the external-access-operation-start-request signal REQ(O) is in competition with the refresh-operation-start-request signal REQ(I) (see symbol (III) of FIG. 16), as illustrated in the access competition (1) and (3), when the refresh operation is executed prior to the external access operation, unnecessary time longer than, or equal to an ability value is added to the amplification time of the refresh operation "tRef" required in the refresh operation. As a result, the access time "tCE" with respect to the external access operation (for example, read operation and write operation) which is executed subsequent to this refresh operation would become longer than, or equal to the ability value. Therefore, there is such a problem that the access time "tCE" cannot be achived in a high speed.

Also, due to a similar reason, the cycle time "tCE" cannot be shortened. That is to say, in the case that a refresh operation is controlled on the side of such a system which controls a semiconductor memory device, the system cannot shorten a time duration defined from a commencement of the refresh operation of the semiconductor memory device up to an end of this refresh operation, which are executed by either a produced refresh signal or a produced refresh command, so that a busy rate of the semiconductor memory device in the system cannot be lowered.

Because of these difficulties, when a system is constituted, there are such problems that both a data-occupation rate and a data-transfer rate in a data bus cannot be increased.

Also, as to such a case that the accesses compete with each other (see symbol (III) of FIG. 16), as shown as the access competition (2), when the external access operation is carried out prior to the refresh operation, longer time than, or equal to the ability value is required for the amplification time "tRef" required for the refresh operation which is executed subsequent to this external access operation. As a result, the cycle time "tCE" cannot be shortened. In the case that a system is constituted, there is another problem that both a data-occupation rate and a data-transfer rate in a data bus cannot be increased.

Also, as to the read operation among the external access operations, since the longer time (namely, tWT-tRD) than, or equal to the ability value is required for the amplification time "tRD", this fact impedes shortening of both the access time and the cycle time in a similar manner.

Also, in such a case that while no access competition occurs, either the refresh operation or the external access operation is solely carried out (see symbols (I) and (II) of FIG. 16), longer time than, or equal to the ability value is necessarily required in either the refresh operation or the read operation, the cycle time "tCE" cannot be shortened. When a system is constituted, both a data-occupation rate and a data-transfer rate in a data bus cannot be increased, resulting in another problem.

Considering now such cases that a so-called "pseudo-SRAM" and a so-termed "pseudo-SSRAM" are realized in a near future, or a semiconductor memory device which requires a new high-speed access operation specification is realized, otherwise, another semiconductor memory device is realized in which a high data-occupation rate specification is required in a data bus when a system is constituted, the following problems may possibly occur in the prior art. That is, when are fresh operation is embedded with in an external access operation, or between successive external access operations, or when a refresh operation is set between successive external access operations, the conventional data access methods cannot be properly applied thereto.

SUMMARY OF THE INVENTION

The present invention has been made to solve the problems of the above-described prior art, and therefore, has an object to provide a data access method of a semiconductor memory device, in the case that in particular, a refresh operation is executed as an internal access operation which is independently carried out with respect to an external access operation, capable of effectively arranging a refresh operation within an external access operation, or between successive external access operations, and also to provide a semiconductor device.

To achieve the above-described object, according to one aspect of the present invention, there is provided a data access method of a semiconductor memory device performing an external access operation for inputting/outputting data with respect to an external device, and a refresh operation corresponding to an internal access operation which does not perform the data input/output operation with respect to the external device, wherein: as compared with differential amplification time of a bit line pair during the external access operation, differential amplification time of the bit line pair during the refresh operation is made shorter.

In the data access method of the semiconductor memory device, according to one aspect of the present invention, the differential amplification time of the bit line pair when the refresh operation is carried out is made shorter than that when the external access operation is carried out.

Also, according to the one aspect of the present invention, there is provided a semiconductor memory device having an external access operation for inputting/outputting data with respect to an external device, and a refresh operation which does not perform the data input/output operation with respect to the external device, comprising: a first timer section for measuring first time as differential amplification time of a bit line pair based upon an external-access-operation-start-request signal; and a second timer section for measuring second time as differential amplification time of a bit line pair based upon a refresh-operation-start-request signal, the second time being shorter than the first time.

In the semiconductor memory device according to the second aspect of the present invention, the first timer section measures the first time as the differential amplification time of the bit line pair based upon the external-access-operation-start-request signal, and the second timer section measures the second time as the differential amplification time of the bit line pair based upon the refresh-operation-start-request signal. Then, this second time is shorter than the first time.

As a consequence, the differential amplification time can be set every operation mode by being fitted to the below-mentioned characteristics as to the circuit arrangement. That is, in this circuit arrangement characteristic, the loads given to the bit line pairs are decreased when the refresh operation is performed during which the data input/output paths are cut out while the data is not inputted/outputted with the external device, whereas the loads given to the bit line pairs are increased when the external access operation is carried out during which the data lines are connected to the bit line pairs through which the data are inputted/outputted to the external device. As a consequence, there is no such a fact that the differential-amplification time is fixed irrespective of the operation mode, and thus, unnecessary differential amplification time is set. To the contrary, the differential-amplification time can be properly set every operation mode, and therefore, the unwanted time can be eliminated in each of the operation modes.

Also, the differential-amplification time during the refresh operation can be shorten, as compared with the differential-amplification time during the external access operation. As a result, during the refresh operation, the refresh operation time can be shortened by eliminating the unnecessary time, and thus the high-speed operation can be achieved. Furthermore, the time duration which can be allocated to the external access operation can be increased, so that the data-occupation rate and the data-transfer rate on the data bus in the case that the system is constituted can be improved.

Also, while the differential amplification time is measured by such a condition that an activating signal of a word line, an activating signal of a sense amplifier, or a signal which is synchronized with these activating signals is used as a starting point, assuming now that the word line is deactivated based upon either an output signal of the first timer section or an output signal of the second timer section, such a time duration defined from the activation of the sense amplifier up to the deactivation of the word line can be measured by either the first timer section or the second timer section by setting either the activating signal of the sense amplifier or the signal which is synchronized with this activating signal as a reference. Thus, the differential amplification time can be properly measured every operation mode.

If the refresh operation having the shortened differential-amplification time is used, then the refresh operation can be embedded within the external access operation, or between the successive external access operations, or the refresh operation can be set between the successive external access operations. As a consequence, the data access method of the present invention can be effectively applied to a so-called "pseudo-SRAM" and a so-termed "pseudo-SSRAM" are realized in a near future, or a semiconductor memory device which requires a new high-speed access operation specification, otherwise another semiconductor memory device in which a high data-occupation rate specification is required in a data bus when a system is constituted.

According to a second aspect of the present invention, there is provided a data access method of a semiconductor memory device performing an external access operation for inputting/outputting data with respect to an external device, and a refresh operation corresponding to an internal access operation which is automatically initiated during a time period of the external access operation, wherein as compared with differential amplification time of a bit line pair during the external access operation, differential amplification time of the bit line pair during the refresh operation is made shorter.

In the data access method of the semiconductor memory device according to the second aspect of the present invention, in such a case that the refresh operation is automatically initiated during the external access operation time period, the differential amplification time of the bit line pair during the refresh operation is shortened, as compared with the differential amplification time of the bit line pair during the external access operation.

As a consequence, since the differential amplification time in the refresh operation is shortened, the refresh operation can be embedded in a higher efficiency within the time period of the external access operation. The occupation rate of the external access operation can be increased, and also, both the data-occupation rate and the data-transfer rate on the data bus can be improved.

When the refresh operation having the shortened differential amplification time is used, the refresh operation can be effectively embedded within the external access operation time period. As a consequence, the data access method of the present invention can be effectively applied to a so-called "pseudo-SRAM" and a so-termed "pseudo-SSRAM" are realized in a near future, or a semiconductor memory device which requires a new high-speed access operation specification, otherwise another semiconductor memory device in which a high data-occupation rate specification is required in a data bus when a system is constituted.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
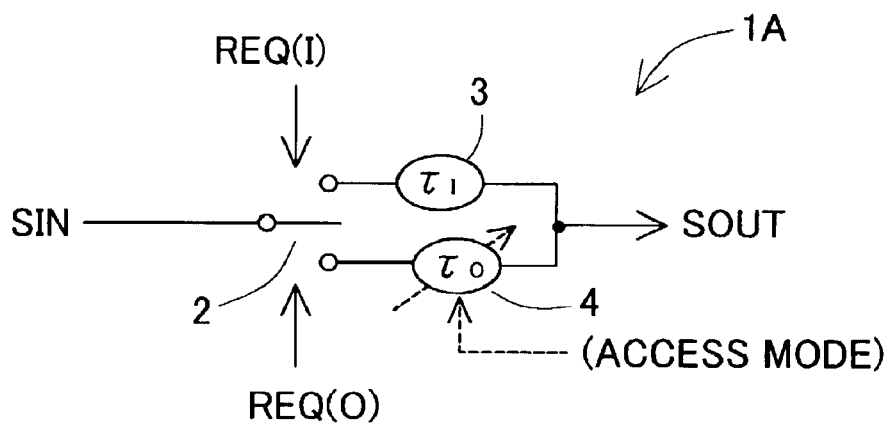
FIG. 1 is an explanatory diagram for explaining a first principle of the present invention.
Figure 2:
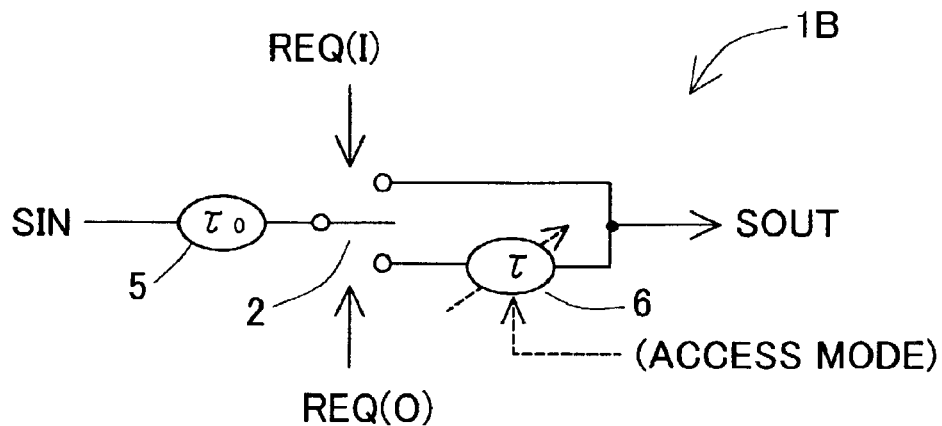
FIG. 2 is an explanatory diagram for explaining a second principle of the present invention.

A first principle explanatory diagram 1A and a second principle explanatory diagram 1B, according to the present invention, are indicated in FIG. 1 and FIG. 2. After a predetermined time has passed from either a commencement of an external access operation or a commencement of a refresh operation, more directly speaking, after a preselected time has elapsed from a commencement of a differential-amplifying operation of a bit line pair, such a signal by which a differential-amplifying operation of the bit line pair is ended is time-measured by different time-measuring sections with respect to each of operation modes, and thereafter, the time-measured signal is outputted. In both the first and second principle explanatory diagrams 1A and 1B, either a start signal or a signal which is synchronized with this start signal is inputted as a time-measuring start signal "SIN", whereas either a stop signal for instructing a stop of a differential amplifying operation or a signal which is synchronized with this stop signal is outputted as a time-measuring stop signal "SOUT." The above-explained start signal indicates a start of the external access operation, a start of the refresh operation, or a start of the differential amplifying operation of the bit line pair. Based upon the time-measuring stop signal "SOUT", a separating operation between a bit line and a memory cell is executed, and/or the differential-amplifying operation of the bit line pair is stopped.

In the first principle explanatory diagram 1A, the time-measuring start signal SIN is entered into a path-switching means 2. The path-switching means 2 is controlled by both an external-access-operation-start-request signal REQ(O) and a refresh-operation-start-request signal REQ(I), and connects an output to either a first timer section 4 or a second timer section 3 in response to each of these request signals REQ(O) and REQ(I). The first timer section 4 and the second timer section 3 measure both time of "τO" and time of "τI", respectively, and thereafter, outputs the time-measuring stop signal "SOUT." In this case, it should be noted that the measuring time of "τO" measured in the first timer section 4 corresponds to differential-amplifying time of a bit line pair when an external access operation is carried out, and the measuring time of "τI" measured in the second timer section 3 corresponds to differential-amplifying time of a bit line pair when a refresh operation is carried out, and also, a relationship of "τI<τO" is established.

Also, the measuring time "τO" may be set in such a manner that this measuring time is variable every operation mode of the external access operation. For instance, measuring time "τO(WT)" during write operation, which owns different time with respect to measuring time "τO(RD)" during read operation may be adjusted every operation mode. Generally speaking, when writing of inverted data during data write operation is considered, such a relationship of τI<τO(RD)<τO(WT) is owned.

In the second principle explanatory diagram 1B of FIG. 2, a time-measuring start signal "SIN" is inputted via a basic timer section 5 which constitutes basic measuring time into a path-switching means 2. This path-switching means 2 is controlled by an external-access-operation-start-request signal REQ(O) and a refresh-operation-start-request signal REQ(I). In response to the respective request signals, the path-switching means 2 directly outputs a time-measuring stop signal SOUT, or connects the time-measuring stop signal SOUT to an auxiliary timer section 6 which auxiliary adds thereto measuring time. In this case, the basic timer section 5 measures the measuring time "τ0", whereas the auxiliary timer section 6 measures auxiliary measuring time "τ." In the case that the refresh-operation-start-request signal REQ(I) is activated, since the time-measuring-request signal SIN is processed by the basic timer section 5 to output the time-measuring stop signal SOUT, differential amplification time during the refresh operation becomes equal to measuring time "τ0" of the basic timer section 5. In the case that the external-access-operation-start-request signal REQ (O) is activated, since the time-measuring start signal SIN is processed via both the basic timer section 5 and the auxiliary timer section 6 to output the time-measuring stop signal SOUT, differential amplification time during the external access operation becomes equal to such a time (τ0+τ) which is obtained by adding the measuring time "τ0" of the basic timer section 5 to the auxiliary measuring time "τ" of the auxiliary timer section 6.

Also, similar to the above-described case of the first principle idea explanatory diagram 1A, the auxiliary measuring time "τ" may be set in such a manner that this auxiliary measuring time "τ" is varied every operation mode of the external access operations. With respect to the measuring time "τ0" of the basic timer section 5 equal to the differential amplification time during the refresh operation, the auxiliary measuring time "τ" to be added may be adjusted every operation mode of the external access operation.

It should also be noted that as to the time-measuring start signal SIN, this start signal has been explained as the start signal indicative of the commencement of the external access operation and the commencement of the refresh operation, or the signal which is synchronized with this start signal. There is, however, a certain case that an external access operation is different from a refresh operation from a start of an access operation up to a start of a differential amplifying operation of a bit line pair. Generally speaking, in the case of the external access operation, as an interface with respect to an external signal, such a process operation is required in an input buffer circuit. That is, the external signal is detected, and a signal level of the external signal is converted. As a result, there are some possibilities that the time duration defined from the start of the external access operation until the differential amplifying operation of the bit line pair is commenced becomes longer than that of the case that the refresh operation is performed. As a result, as the time-measuring start signal SIN, such an internal signal which has been interface-processed with respect to the external signal may be preferably employed. As an example of this internal signal, the following signals may be conceived, namely, the external-access-operation-start-request signal REQ(O), the refresh-operation-start-request signal REQ(I), or the signal for starting the differential amplifying operation of the bit line pair such as the sense amplifier activating signal, otherwise a signal which is synthesized with these signals, may be conceived as this internal signal.

Referring now to FIG. 3 to FIG. 13, a first embodiment to a fifth embodiment, which exemplify both a data access method of a semiconductor memory device and also a semiconductor memory device according to the present invention, will be described in detail.

Figure 3:
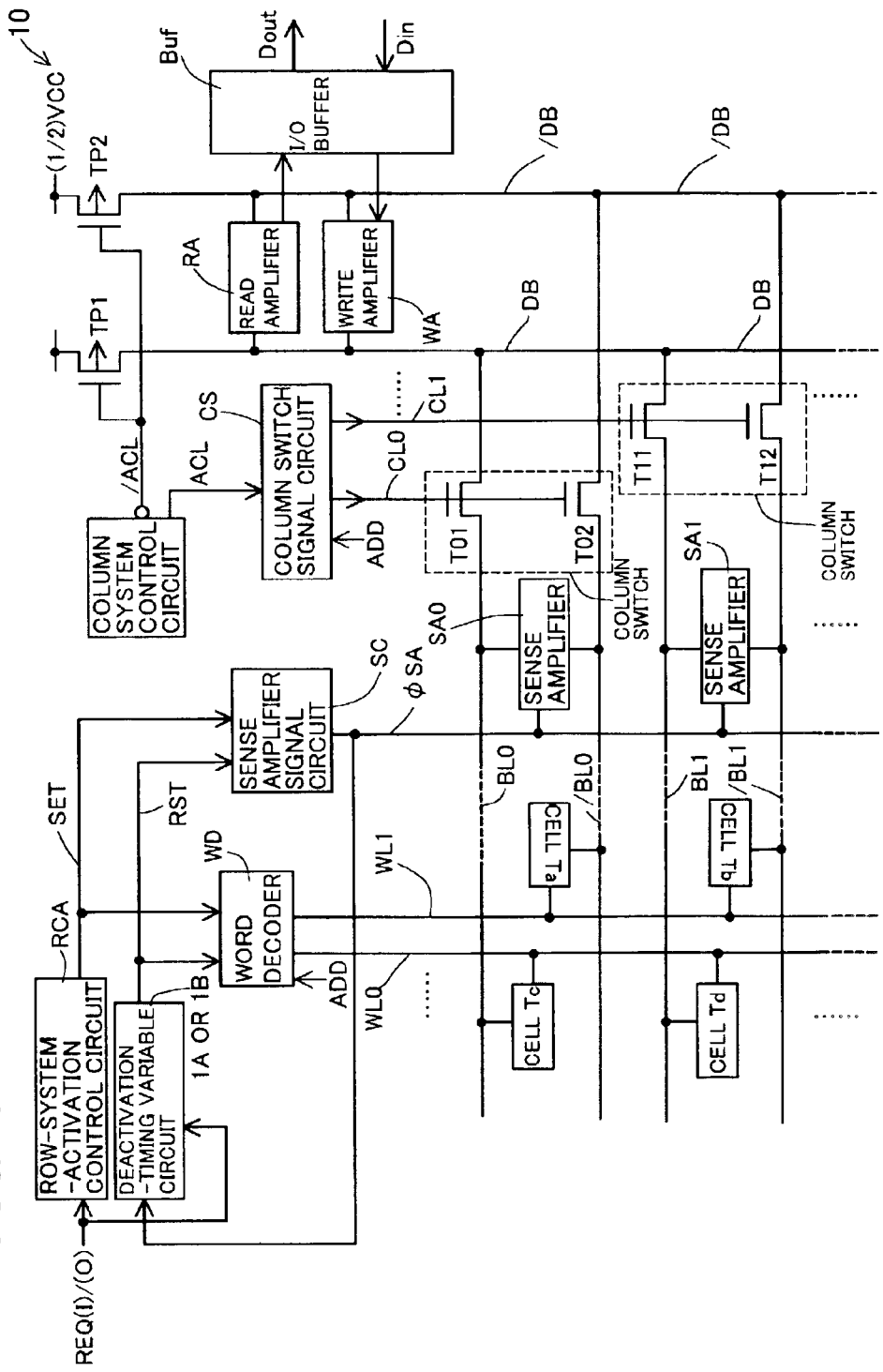
FIG. 3 is a circuit block diagram for indicating a data input/output path to which the present invention is applied.

A circuit block 10 shown in FIG. 3, defined from a memory cell to a data input/output path in a semiconductor memory device to which the present invention has been applied is provided with a deactivation-timing variable circuit (namely, either first principle idea explanatory diagram 1A or second principle idea explanatory diagram 1B), instead of the deactivation timing circuit 100 employed in the circuit block 1000 for the conventional data input/output path.

In the deactivation timing circuit 100 of the prior art, after the predetermined delay time is fixed from the activating signal SET, the deactivating signal RST is outputted which may deactivate both the word lines WL0 and WL1, and the sense amplifier activating signal φSA. In contrast thereto, in the above-explained deactivation-timing variable circuit (1A, or 1B), while the activation timing of the sense amplifier activating signal φSA is employed as a starting point, a deactivating signal RST is outputted at such a timing which is varied in response to the external-access-operation/refresh-operation-start-request signal REQ(O)/REQ(I).

It should be noted that in FIG. 3, PMOS transistors TP1 and TP2 corresponding to precharge elements of data lines DB and /DB may be constructed as follows: That is to say, the control signal /ACL of the PMOS transistors TP1 and TP2 are continuously activated during either the refresh operation or the read operation, so that the data line pair (DB and /DB) is equalized to an arbitrary potential, or a voltage amplitude is limited. Also, this control signal /ACL is deactivated during the write operation, so that the data line pair (DB and /DB) is set to the operating voltage of the write amplifier WA. Further, the (½) VCC voltage may be replaced by an arbitrary voltage. Also, the data input/output path circuit may be arranged by that instead of the activating signal SET corresponding to the activation signal of the sense amplifier signal circuit SC, a signal derived from the word decoder WD is inputted, so that the sense amplifier signal circuit SC may be activated after a predetermined time has passed from the activation signal of the word lines WL0 and WL1.

Furthermore, the input signal to either the deactivation-timing variable circuit 1A or 1B may be changed into a signal indicative of activation of the word decoder WD. In other words, instead of the output signal φSA of the sense amplifier signal circuit SC, the signal derived from the word decoder WD may be inputted.

With respect to the deactivation-timing variable circuits 1A and 1B shown in both the first and second principle idea explanatory diagrams, more concrete structures will now be explained based upon the first to third embodiments.

Figure 4:
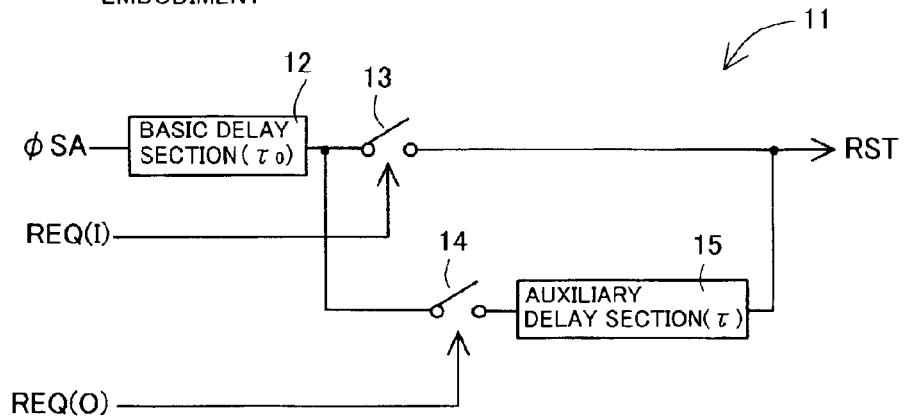
FIG. 4 is a circuit arrangement diagram for representing a deactivation-timing variable circuit according to a first embodiment of the present invention.

A deactivation-timing variable circuit 11 of the first embodiment, shown in FIG. 4, corresponds to an embodiment of the second principle explanatory diagram 1B. The sense amplifier activating signal φSA entered as the time-measuring start signal SIN is inputted into a basic delay section 12 which functions as the basic timer section 5, and an output of this basic delay section 12 is connected to switch sections 13 and 14, corresponding to the path switching means 2. An output signal of the switch section 13 is directly outputted as the deactivating signal RST, whereas an output signal of the switch section 14 is outputted as the deactivating signal RST via an auxiliary delay section 15 which functions as the auxiliary timer section 6. The refresh-operation-start-request signal REQ(I) and the external-access-operation-start-request signal REQ(O) are inputted as control signals to the switch sections 13 and 14, respectively.

When the operation mode is the refresh operation, the refresh-operation-start-request signal REQ(I) is activated, so that the switch section 13 is brought into the conductive state. At this time, since the external-access-operation-start-request signal REQ(O) is set under deactivation, the non-conductive stage of the switch section 14 is maintained. When the refresh operation is executed and then, the sense amplifier activating signal φSA is activated, the deactivating signal RST is outputted from the basic delay section 12 via the switch section 13. At the measuring time "τ0" after the differential amplifying operations of the bit line pairs (BL0; BL1 and /BL0; /BL1) are commenced by the sense amplifier activating signal φSA, such a deactivating signal RST is outputted which corresponds to a reference signal which may deactivate the word lines WL0 and WL1, and the sense amplifier activating signal φSA. Since a load given to the bit line pair is suppressed to a low load value during the refresh operation, voltages of the bit lines BL0; BL1 and /BL0; /BL1, which are differential-amplified only for the measuring time τ0, may reach restore levels, so that the differential amplifying operation can be completed within the shortened differential amplification time which is fitted to the refresh operation.

When the operation mode is the external access operation, the external-access-operation-start-request signal REQ(O) is activated, so that the switch section 14 is brought into the conductive state. At this time, since the refresh-operation-start-request signal REQ(I) is set under deactivation, the non-conductive stage of the switch section 13 is maintained. When the external access operation is executed and then, the sense amplifier activating signal φSA is activated, the deactivating signal RST is outputted from the basic delay section 12 via the switch section 14, and further via the auxiliary delay section 15. At the measuring time "τ0+τ" after the differential amplifying operations of the bit line pairs (BL0; BL1 and /BL0; /BL1) are commenced by the sense amplifier activating signal φSA, such a deactivating signal RST is outputted which may deactivate the word lines WL0 and WL1, and the sense amplifier activating signal φSA. Since the data bus is connected to the bit line during the external access operation, a load given to the bit line pair becomes heavy, as compared with that during the refresh operation. Otherwise, a disturb phenomenon of the bit line pairs (BL0; BL1 and /BL0; /BL1) will occur due to re-distribution of electron charges with respect to the data lines DB and /DB, which have been precharged to the (½) VCC voltage. As a result, a time duration during which the bit line voltage reaches a predetermined voltage level is prolonged, as compared with the measuring time "τ0" during the refresh operation. Since such a measuring time "τ0+τ" is measured which is obtained by adding thereto the auxiliary measuring time "τ" by the auxiliary delay section 15, the differential-amplifying operation may be completed within the differential amplification time which is fitted to the external access operation.

Figure 16:
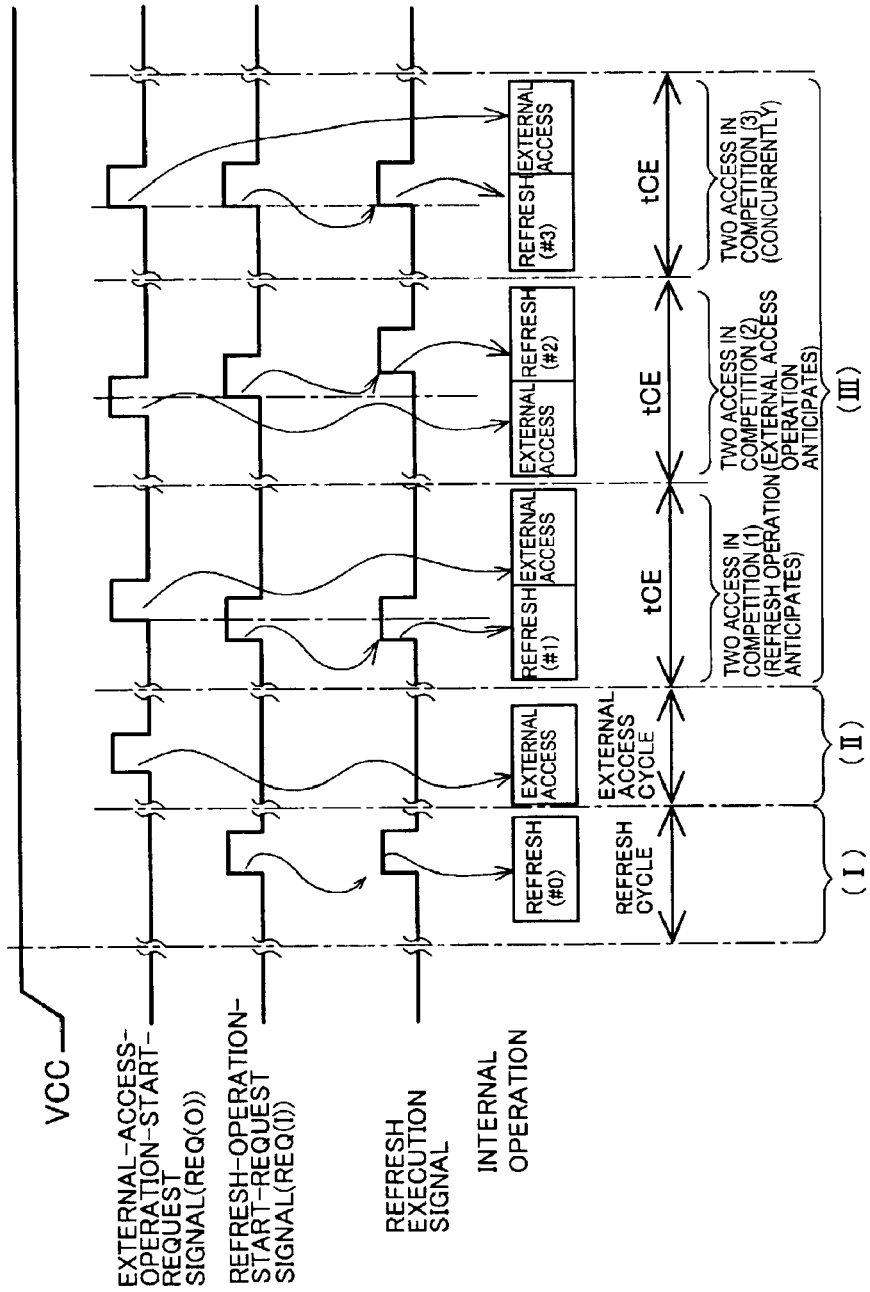
FIG. 16 is a timing chart for showing the refresh operation executed in the pseudo-SRAM of the prior art.
Figure 17:
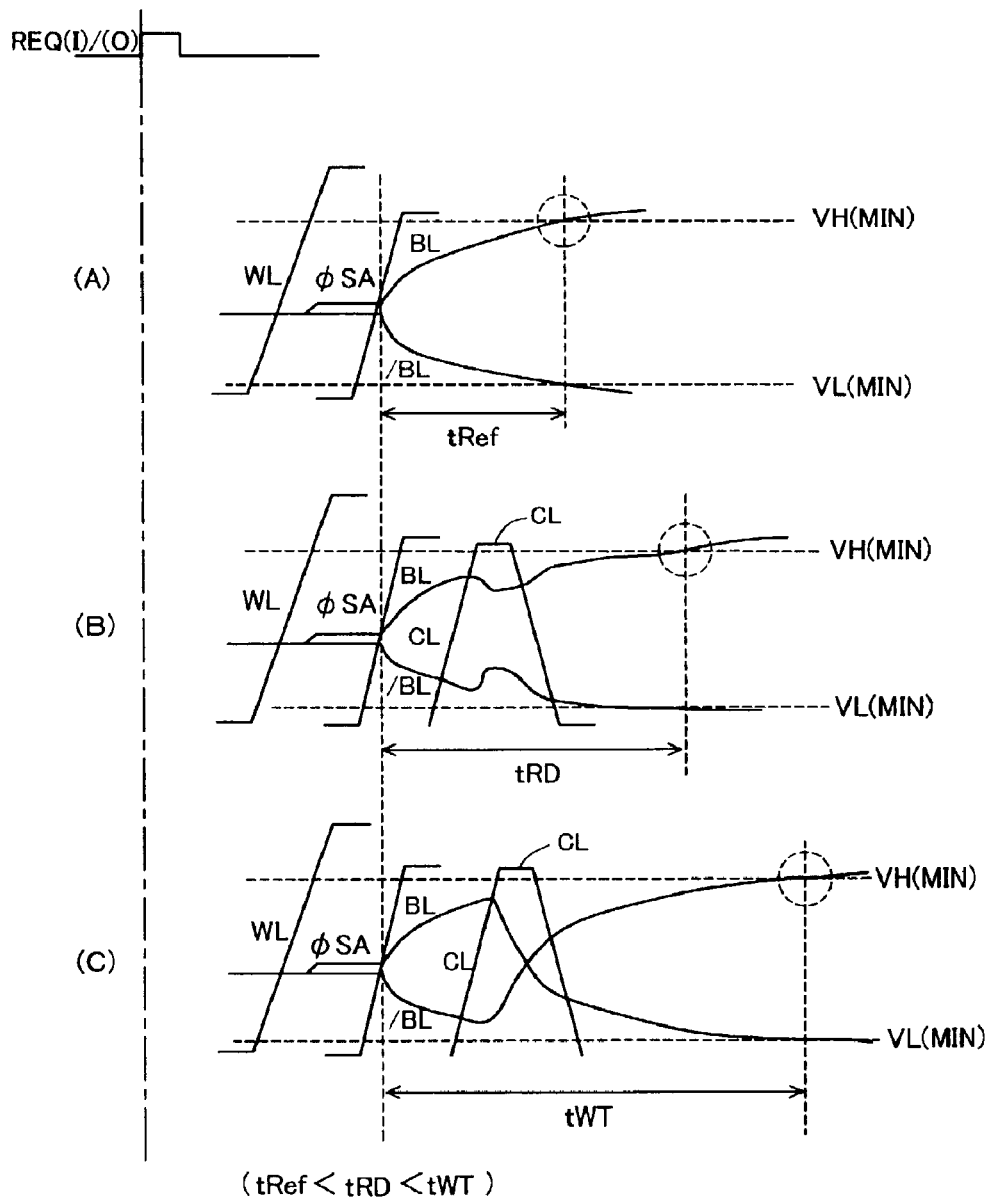
FIG. 17 is a waveform diagram for indicating comparisons of the bit line pair amplifying operations in the respective operation modes.
Figure 18:
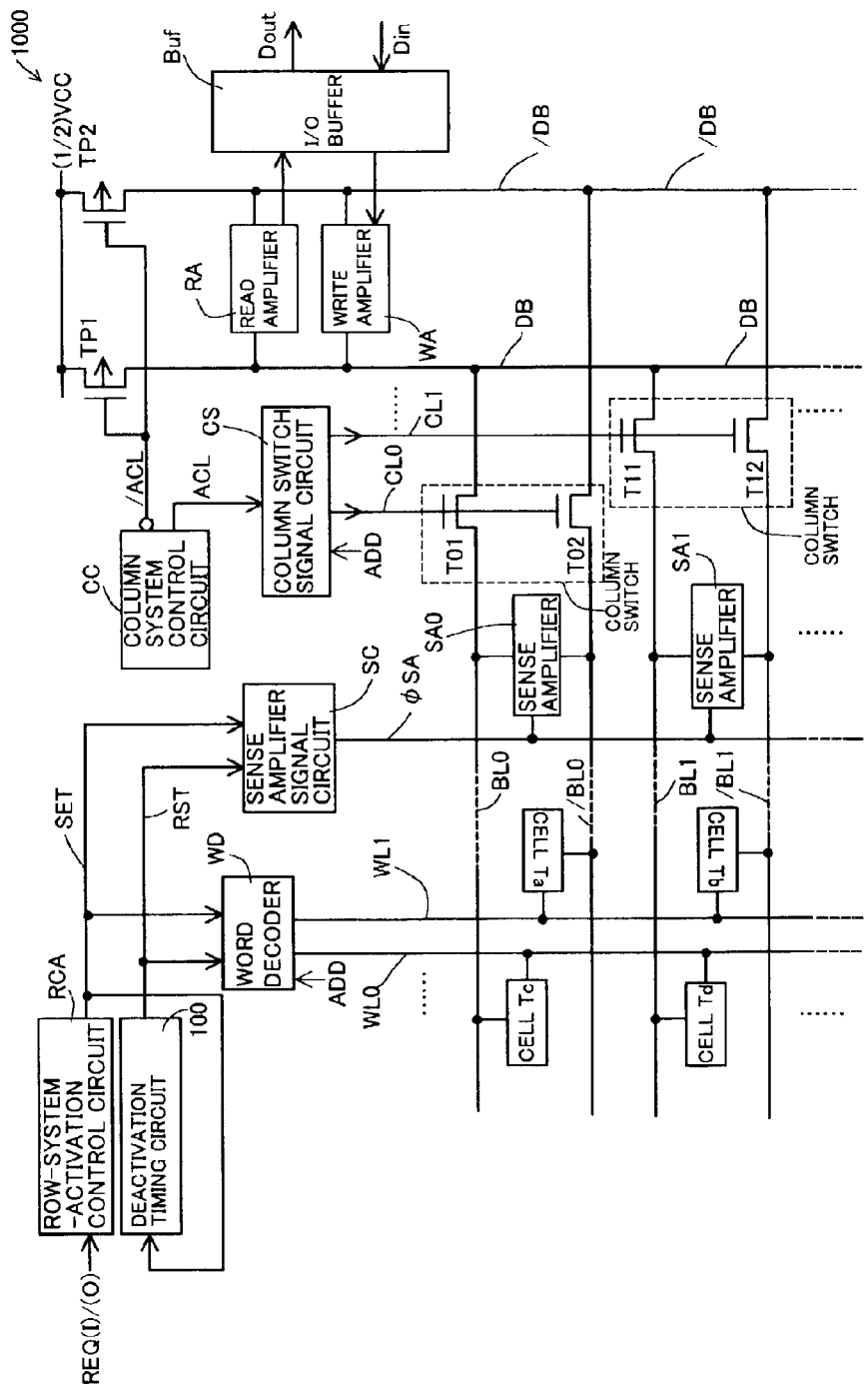
FIG. 18 is a circuit block diagram for indicating the data input/output path of the prior art.

In such a case that the external access operation is in competition with the refresh operation, as indicated in the access competitions (1) to (3) of FIG. 16, the operations are sequentially carried out in a continuous manner by an arbiter. Also in this case, the measuring time "τ0" or "τ0+τ", which are fitted to the operation modes, may be set by the switch sections 13 or 14 which is selected in response to the respective operation-start-request signals REQ(I) or REQ (O) which is outputted every operation mode, whereby the differential amplification time is properly set.

It should also be noted that when such a structure is made that the basic delay section 12 is inserted into the post stage of the switch section 13, and the sense amplifier activating signal φSA is directly coupled to both the switch section 13 and the switch section 14, the structure of the first principle explanatory diagram 1A may be realized. In this case, the auxiliary delay section 15 is set to measure the measuring time "τ0+τ" which is required in the external access operation, instead of the measuring time "τ."

Figure 5:
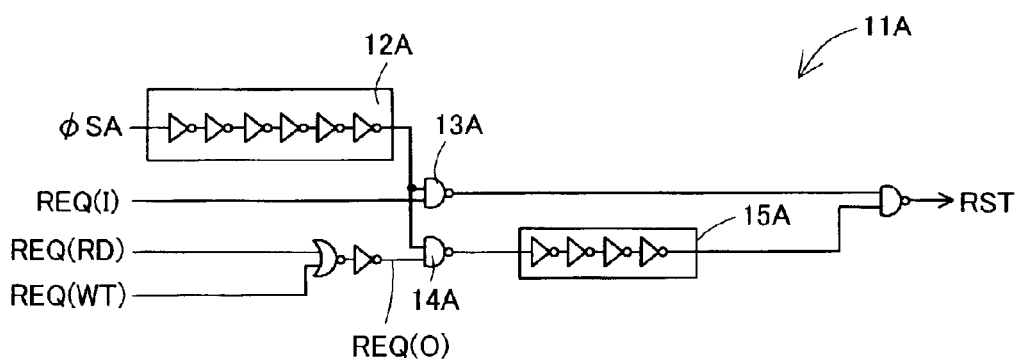
FIG. 5 is a circuit diagram for indicating a specific example of the first embodiment.

FIG. 5 indicates a specific example 11A of the deactivation-timing variable circuit 11 according to the first embodiment. This specific example 11A is arranged as follows: While a basic delay circuit 12A for series-connecting even-numbered stages (six stages are exemplified in FIG. 5) of inverter logic gates to each other is employed as the basic delay section 12, an auxiliary delay circuit 15A for series-connecting even-numbered stages (four stages are exemplified in FIG. 5) to each other is used as the auxiliary delay section 15. Also, as the switch sections 13 and 14, a NAND logic gate 13A and another NAND logic gate 14A are provided.

The refresh-operation-start-request signal REQ(I) and the external-access-operation-start-request signal REQ(O), the high logic levels of which are set as activation levels, are inputted into one input terminal of each of these NAND logic gates 13A and 14A. Since the NAND logic gates 13A and 14A into which such a request signal activated among these operation-request-start-request signals REQ(I) and REQ(O) is entered may function as a logic inverting gate, a signal propagation path is formed and the time measuring operation is carried out. As to the NAND logic gates 14A and 13A into which the deactivating operation-start-request signals REQ(O) and REQ(I) are inputted the output signals are fixed to the high logic levels, so that no signal propagation path is formed.

In such a case that the refresh-operation-start-request signal REQ(I) is activated, the sense amplifier activating signal φSA is outputted as the deactivating signal RST via the basic delay circuit 12A, and the NAND logic gate 13A which functions as the logic inverting gate, and furthermore, via a NAND logic gate which is provided at an output stage by applying thereto the measuring time "τ0." In this case, the NAND logic gate provided at the output stage may function as a logic inverting gate, since a high logic level is entered into another input terminal where the signal propagation path is set under the deactivating condition.

In such a case that the external-access-operation-start-request-signal REQ(O) is activated, the sense amplifier activating signal φSA is outputted as the deactivating signal RST via the basic delay circuit 12A, and the NAND logic gate 14A which functions as the logic inverting gate, and also the auxiliary delay circuit 15A, and furthermore, via a NAND logic gate which is provided at an output stage by applying thereto the measuring time "τ0+τ." Also, in this case, the NAND logic gate provided at the output stage may function as a logic inverting gate.

Also, the external-access-operation-start-request signal REQ(O) is produced by OR-gating a read-operation-start-request signal REQ(RD) and a write-operation-start-request signal REQ(WT). The OR-gating calculation is constituted by a NOR logic gate and an inverter logic gate.

It should also be noted that in the specific example 11A, the deactivating signal RST is constituted as such a signal having the same phase as that of the sense amplifier activating signal φSA. Alternatively, this specific example 11A may be realized by a circuit arrangement for producing a signal having a reverse phase as that of the sense amplifier activating signal φSA. For instance, when the stage number of the inverter logic gates employed in the basic delay circuit 12A is selected to be an odd-numbered stage, the deactivating signal RST to be outputted may be produced as a reverse-phased signal.

Also, both the basic delay section 12 and the auxiliary delay section 15, which execute the time measuring operation, are arranged as both the basic delay circuit 12A and the auxiliary delay circuit 15A by employing the inverter logic gates. Alternatively, a delay element, a delay circuit, and other timer circuits except for the inverter logic gate may be used. For instance, while a capacitive element may be used as the delay element, these basic delay circuit 12A and auxiliary delay circuit 15A may be arranged by a CR delay circuit, a digital-circuited timer circuit by using a counter and the like, or an analog-circuited timer circuit by using a capacitive element and a constant current source circuit.

Figure 6:
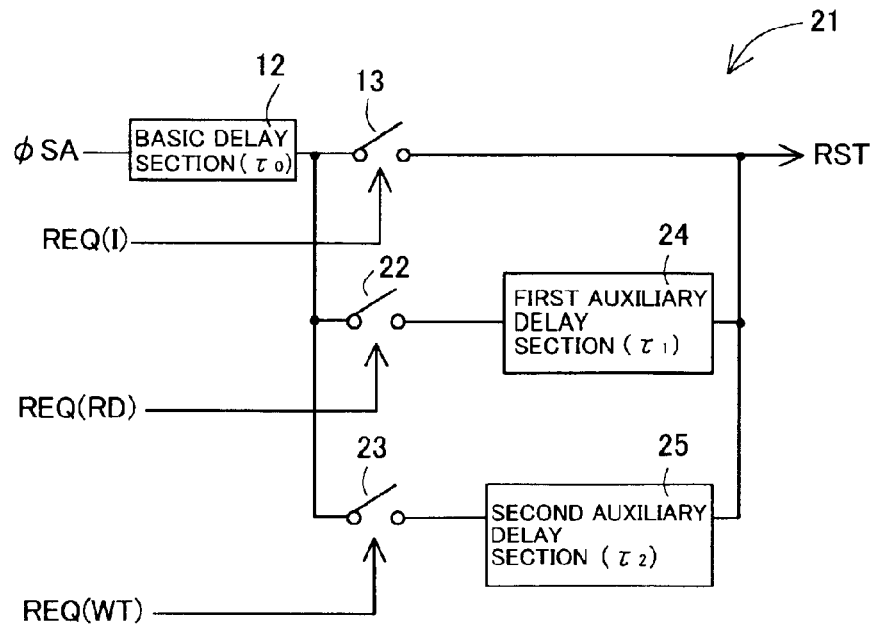
FIG. 6 is a circuit arrangement diagram for representing a deactivation-timing variable circuit according to a second embodiment of the present invention.

A deactivation timing variable circuit 21 according to a second embodiment, shown in FIG. 6, is provided with a switch section 22, a first auxiliary delay section 24 connected to this switch section 22, another switch section 23, and a second auxiliary delay section 25 connected to this switch section 23, instead of both the switch section 14 and the auxiliary delay section 15 connected to this switch section 14 employed in the deactivation timing variable circuit 11 of the first embodiment. The read-operation-start-request signal REQ(RD) and the write-operation-start-request signal REQ(WT) are entered as control signals into the switch sections 22 and 23, respectively.

When the refresh-operation-start-request signal REQ(I) is activated in the deactivation timing variable circuit 21, since similar effects/operations to these of the deactivation timing variable circuit according to the first embodiment can be achieved, explanations thereof are omitted.

In the case that the operation mode is the external access operation, either the read-operation-start-request signal REQ(RD) or the write-operation-start-request signal REQ(WT) is activated with respect to each of the operation modes in the external access operation.

In the case that the read-operation-start-request signal REQ(RD) is activated, the switch section 22 is brought into a conductive state. When the sense amplifier activating signal φSA is activated, the deactivating signal RST is outputted from the basic delay section 12 via the switch section 22 and furthermore the first auxiliary delay section 24. At the measuring time (τ0+τ1) since the differential-amplifying operation of the bit line pair by the sense amplifier activating signal φSA is commenced, such a deactivating signal RST is outputted which is used to deactivate the word lines WL0 and WL1, and the sense amplifier activating signal φSA. While the read operation is carried out, the data lines DB and /DB are connected to the bit lines (BL0, BL1, /BL0, and /BL1), a disturb phenomenon of the bit lines will occur due to re-distribution of the charges with respect to the data lines. As a result, a time duration during which the bit line voltage reaches a predetermined voltage level must be made longer than the measuring time "τ0" when the refresh operation is carried out. Since such a measuring time "τ0+τ1" is measured which is obtained by adding thereto the first auxiliary measuring time "τ1" by the first auxiliary delay section 24, the differential-amplifying operation may be completed within the differential amplification time which is fitted to the read operation.

In the case that the write-operation-start-request signal REQ(WT) is activated, the switch section 23 is brought into a conductive state. When the sense amplifier activating signal φSA is activated, the deactivating signal RST is outputted from the basic delay section 12 via the switch section 23 and furthermore the second auxiliary delay section 25. At the measuring time (τ0+τ2) since the differential-amplifying operation of the bit line pairs (BL0; BL1 and /BL0; /BL1) by the sense amplifier activating signal φSA is commenced, such a deactivating signal RST is outputted. While the write operation is carried out, there is such a case that such data is written which is inverted from the data which has been stored in the memory cell, and is being amplified with respect to the bit line pair. As a result, a time duration during which the bit line voltage reaches a predetermined voltage level must be made longer than the measuring time "τ0" when the refresh operation is carried out. Since such a measuring time "0+2" is measured which is obtained by adding thereto the auxiliary measuring time "τ2" by the second auxiliary delay section 25, the differential-amplifying operation may be completed within the differential amplification time which is fitted to the write operation.

As another case, when the external access operation is in competition to the refresh operation, proper measuring time "τ0", "τ0+τ1", and "τ0+τ2" may be set based upon the operation-start-request signals REQ(I), REQ(RD), and REQ(WT) in response to the respective operation modes with respect to the operation modes which are sequentially carried out in the continuous manner. Also, when the basic delay section 12 is inserted at a post stage of the switch section 13, and also the sense amplifier activating signal φSA is directly connected to the switch sections 13, 22, 23, the arrangement of the first principle explanatory diagram 1A may be realized in a similar manner to that of the first embodiment.

Figure 7:
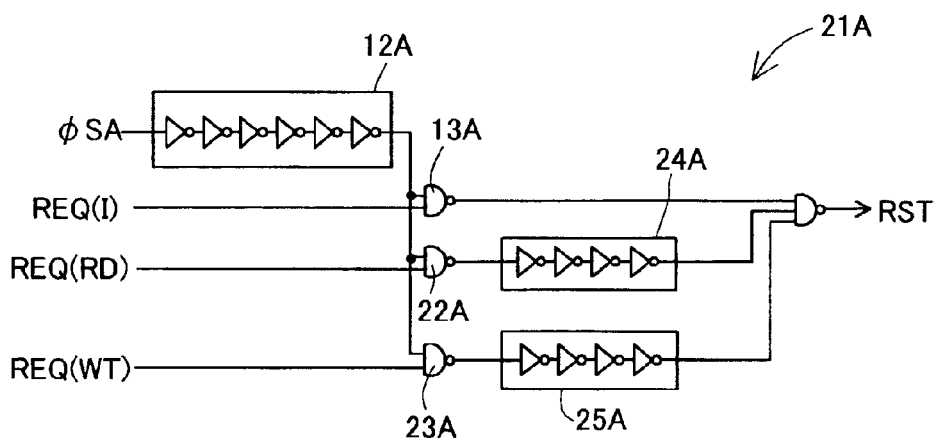
FIG. 7 is a circuit diagram for indicating a specific example of the second embodiment.

In an specific example 21A of the deactivation-timing variable circuit 21 of the second embodiment shown in FIG. 7, as the first auxiliary delay section 24 and the second auxiliary delay section 25, a first auxiliary delay circuit 24A and a second auxiliary delay circuit 25A are provided. In each of these first and second auxiliary delay circuits 24A and 25A, an even-numbered stage (four stages are exemplified in case of FIG. 7) of inverter logic gates are series-connected to each other. Also, as the switch sections 22 and 23, NAND logic gates 22A and 23A are provided.

The read-operation-start-request signal REQ(RD) and the write-operation-start-request signal REQ(WT), the high logic levels of which are set as activation levels, are inputted into one input terminal of each of these NAND logic gates 22A and 23A. In the external access operation, any one of these read/write-operation-start-request-signals REQ(RD)/(WT) is activated, and the NAND logic gates 22A or 23A into which the activated operation-start-request signal is entered may function as logic inverting gates, so that a signal propagation path is formed, and the time measuring operation is carried out.

In such a case that the refresh-operation-start-request-signal REQ(I) is activated, the sense amplifier activating signal φSA is outputted as the deactivating signal RST via the basic delay circuit 12A, and the NAND logic gate 13A which functions as the logic inverting gate, and furthermore, via a NAND logic gate which is provided at an output stage by applying thereto the measuring time "τ0." Also, in such a case that the read-operation-start-request signal REQ(RD) among the external access operations is activated, the sense amplifier activating signal φSA is outputted as the deactivating signal RST via the basic delay circuit 12A, the NAND logic gate 22A which functions as the logic inverting gate, and the first auxiliary delay circuit 24A, and further, via the NAND logic gate provided at the output stage by applying thereto the measuring time (τ0+τ1). Moreover, in such a case that the write-operation-start-request signal REQ(WT) among the external access operations is activated, the sense amplifier activating signal φSA is outputted as the deactivating signal RST via the basic delay circuit 12A, the NAND logic gate 23A which functions as the logic inverting gate, and the second auxiliary delay circuit 25A, and further, via the NAND logic gate provided at the output stage by applying thereto the measuring time (τ0+τ2).

It should be understood that the above-described explanations made in the specific example 1A of the first embodiment may be similarly applied as to the above-explained circuit operations, a phase of the deactivating signal RST with respect to the sense amplifier activating signal φSA, and furthermore, the circuit arrangement of the basic delay section 12, the first auxiliary delay section 24, and the second auxiliary delay section 25, which execute the time measuring operation.

Figure 8:
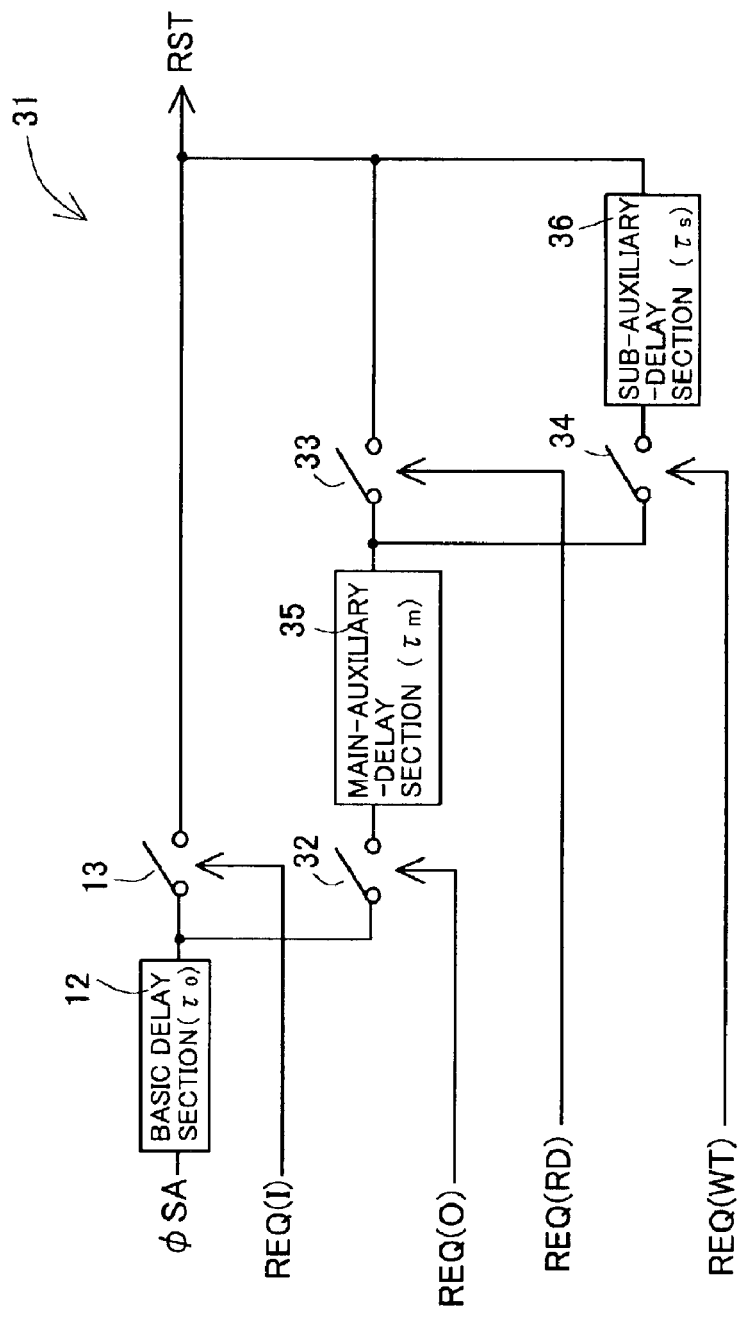
FIG. 8 is a circuit arrangement diagram for representing a deactivation-timing variable circuit according to a third embodiment of the present invention.

A deactivation-timing variable circuit 31 according to a third embodiment, shown in FIG. 8, is provided with a switch section 32, a main-auxiliary-delay section 35 connected to this switch section 32, switch sections 33 and 34 which are connected to an output of the main-auxiliary-delay section 35, and also, a sub-auxiliary-delay section 36 which is connected to the switch section 34, instead of the switch section 14 and the auxiliary delay section 15 connected to this switch section 14, which are employed in the deactivation-timing variable circuit 11 of the first embodiment, otherwise, both the switch sections 22 and 23, and also both the first auxiliary delay section 24 and the second auxiliary delay section 25, which are employed in the deactivation-timing variable circuit 21 according to the second embodiment. The external-access-operation-start-request signal REQ(O), the read-operation-start-request signal REQ(RD), and also, the write-operation-start-request signal REQ(WT) are inputted as a control signal to the switch sections 32, 33, and 34, respectively.

In the deactivation-timing variable circuit 21, the time which was added to the measuring time "τ0" of the basic delay section 12 in response to the operation mode in the external access operations has been independently measured by the first auxiliary delay section 24 and the second auxiliary delay section 25. In contrast to this deactivation-timing variable circuit 21, the deactivation-timing variable circuit 31 is constituted by two stages in such a manner that only measuring time "τm" is added by the main-auxiliary-delay section 35 during the read operation, and furthermore, measuring time "τs" is added by the sub-auxiliary-delay section 36 during the write operation. Thus, the measuring time during the read operation is equal to (τ0+τm), whereas the measuring time during the write operation is equal to (τ0+τm+τs).

In the case that the read-operation-start-request signal REQ(RD) is activated, since the external-access-operation-start-request signal REQ(O) is also activated at the same time, both the switch sections 32 and 33 are brought into conductive states at the same time, and a signal propagation path passing via the main-auxiliary-delay section 35 is established. In the case that the write-operation-start-request signal REQ(WT) is activated, since the external-access-operation-start-request signal REQ(O) is also activated at the same time, both the switch sections 32 and 34 are brought into conductive states at the same time, and a signal propagation path passing via the main-auxiliary-delay section 35 and the sub-auxiliary-delay section 36 is established.

In such a case that the refresh-operation-start-request signal REQ(I) is activated, since operations of this deactivation-timing variable circuit 31 are similar to those of the deactivation-timing variable circuits 11 and 21 of the first and second embodiments, explanations thereof are omitted. Also, such a technical point as to effects/operations achieved in the case that the external access operation is in competition to the refresh operation, and changing of the arranging position of the basic delay section 12, by which the arrangement of the first principle explanatory diagram 1A can be made, is similar to that of the first and second embodiments.

Figure 9:
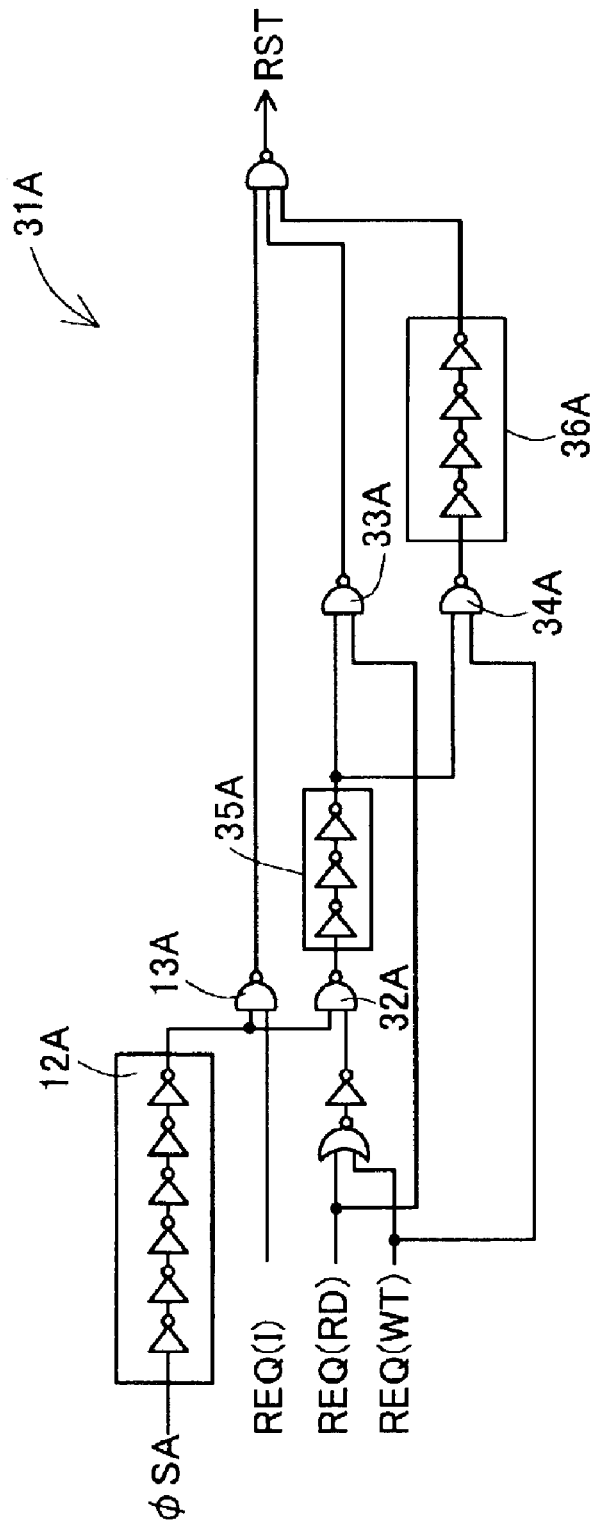
FIG. 9 is a circuit diagram for indicating a specific example of the third embodiment.

Similar to the first and second embodiments, in a specific example 31A of the deactivation-timing variable circuit 31 according to a third embodiment, shown in FIG. 9, both a basic delay circuit 12A and a NAND logic gate 13A. Also, a circuit arrangement as to both a NAND logic gate 32A and an OR gate provided at a front stage is made in a similar arrangement of the first embodiment.

A main-auxiliary-delay circuit 35A functioning as the main-auxiliary delay section 35 is constituted by an odd-numbered stage (three stages are exemplified in FIG. 9) of inverter logic gates. While a NAND logic gate 33A which may function as the switch section 33 is connected to a post stage of this main-auxiliary-delay circuit 35A, this NAND logic gate 33A may constitute a logic inverting gate when the read-operation-start-request signal REQ(RD) is activated.

A sub-auxiliary-delay circuit 36A functioning as the sub-auxiliary delay section 36 is constituted by an even-numbered stage (four stages are exemplified in FIG. 9) of inverter logic gates. While a NAND logic gate 34A which may function as the switch section 34 is connected to a prestage of this sub-auxiliary-delay circuit 36A, this NAND logic gate 34A may constitute a logic inverting gate when the write-operation-start-request signal REQ(WT) is activated.

When a signal propagation path is established, since the NAND logic gates may function as the logic inverting gates, this deactivation-timing variable circuit 31 is constructed in such a manner that the deactivating signal RST is outputted as such a signal having the same phase as the phase of the sense amplifier activating signal φSA, while involving a total number of these NAND logic gates provided on the respective signal propagation paths, and also such a fact that a total number of the inverter logic gates of the main-auxiliary-delay circuit 35A during the read operation.

It should be understood that the above-described explanations made in the specific example 11A of the first embodiment may be similarly applied as to the above-explained circuit operations, a phase of the deactivating signal RST with respect to the sense amplifier activating signal φSA, and furthermore, the circuit arrangement of the basic delay section 12, the main-auxiliary delay section 35, and the sub-auxiliary delay section 36, which execute the time measuring operation.

As apparent from the above-described detail explanations, in accordance with the data access methods of the semiconductor memory devices and also the semiconductor memory devices, related to the first to third embodiments, while the present invention can be fitted to the below-mentioned characteristic as to the circuit arrangement, the differential-amplification time can be properly set every operation mode. That is, in this circuit arrangement characteristic, the loads given to the bit line pair (BL0 and /BL0) and the bit line pair (BL1 and /BL1) are decreased when the refresh operation is performed during which the data lines DB and /DB corresponding to the input/output path are cut out while the data is not inputted/outputted with the external device, whereas the loads given to the bit line pairs (BL0; BL1 and /BL0; /BL1) are increased when the external access operation is carried out during which the data lines DQ and /DQ are connected to the bit line pairs (BL0; BL1 and /BL0; /BL1) through which the data are inputted/outputted to the external device. As a consequence, there is no such a fact that the differential-amplification time is fixed irrespective of the operation mode, and thus, unnecessary differential amplification time is set. To the contrary, the differential-amplification time can be properly set every operation mode, and therefore, the unwanted time can be eliminated in each of the operation modes.

Also, the differential-amplification time during the refresh operation can be shorten, as compared with the differential-amplification time during the external access operation. As a result, during the refresh operation, the refresh operation time can be shortened by eliminating the unnecessary time, and thus the high-speed operation can be achieved. Furthermore, the time duration which can be allocated to the external access operation can be increased, so that the data-occupation rate and the data-transfer rate on the data bus in the case that the system is constituted can be improved.

Also, assuming now that a time duration until a word line is brought into a deactivation state from an activating signal of the word line, an activating signal of a sense amplifier, or a signal which is synchronized with these activating signals, is defined as differential-amplification time, the word line may be deactivated for the proper differential-amplification time every operation mode so as to cut out a memory cell from a bit line, and the present operation may be transferred to the next operation at proper timing every operation mode. As a result, the high-speed access operation can be realized, and also, the cycle time can be shortened.

Also, the refresh operation which is executed in a synchronism with the external access operation may be carried out at such a timing which is independently provided with this external access operation.

Also, it is preferable that the refresh operation is automatically initiated based upon an internal control of a semiconductor memory device. As a result, the refresh operation, the differential-amplification operation of which has been shortened, may be automatically executed.

Also, in such a case that the external access operation is in competition to the refresh operation, even when the operations are sequentially executed while having the arbitration function, the respective operations can be executed in the proper differential-amplification time every operation mode. As a consequence, a time duration defined from an execution of a preceding operation until an execution of a succeeding operation can be shortened, and thus, the operations can be carried out in high speeds. Also, since the differential-amplification time is shortened in the refresh operation, such a time duration which is allowable to the external access operation can be increased, so that the data-occupation rate and the data-transfer rate on the data bus can be improved.

Also, such predetermined timing at which any one of operations which has been executed in a preceding order is accomplished and thereafter the other operation is again executed is preferably selected to be the shortest timing subsequent to the completion of the above-described preceding execution of the operation. In this case, there are two cases: In one case, one precedently-executed operation corresponds to the external access operation, and the other subsequently-executed operation corresponds to the refresh operation. In the other case, one precedently-executed operation corresponds to the refresh operation, and the other subsequently-executed operation corresponds to the external access operation. As a consequence, when operation modes are in competition to each other, both the operations are carried out in a continuous manner, and thus, a time duration until the executions of both operations are accomplished can become the shortest time. As a result, when these operations are in competition to each other, the high-speed access time can be realized and the cycle time can be shortened. In other words, in the case that the refresh operation is carried out at atop priority, the access time of the external access operation can be carried out in a high speed. Also, even in such a case that any one of the external access operation and the refresh operation is executed at a top priority, since both the external access operation and the refresh operation are continued at the shortest timing in addition to the short differential-amplification time in the refresh operation, the time duration until both these access/refresh operations are ended can be made minimum, and further, both the data-occupation and the data-transfer rate on the data bus can be improved. When the refresh operation is carried out in a synchronism with the external access operation, both the refresh operation and the external access operation can be executed in a proper manner.

Also, when the completion of the precedently-executed operation is made coincident with such a timing at which the equalization operation of the differentially-amplified bit line pair is accomplished, the subsequently-executed operation can be continued at the shortest timing from the completion of one precedently-executed operation.

Furthermore, the basic delay section 12 corresponding to the second timer section may be commonly employed in the case that the measuring time "τ0" corresponding to the second time during the refresh operation is measured, in the case that the measuring time "τ0+τ" (first embodiment) corresponding to the first time during the external access operation is measured, or in the case that the measuring time "τ0" is measured, and also in the case that both either the measuring time "τ0+τ1" (second embodiment) or the measuring time "τ0+τm" (third embodiment), corresponding to read-amplification time, and also, either the measuring time "τ0+τ2" (second embodiment) or the measuring time "τ0+τm+τs" (third embodiment), corresponding to write-amplification time, are measured. As a result, the circuit scale of the structural circuit can be compressed.

Also, according to the third embodiment, the main-auxiliary-delay section 35 corresponding to a readout timer section may be commonly used in the case that the measuring time "τ0+τm" corresponding to the read-amplification time is measured, and also, in the case that the measuring time "τ0+τm+τs" corresponding to the write-amplification time is measured. As a consequence, the circuit scale of the structural circuit can be compressed.

Also, in accordance with either the second embodiment or the third embodiment, the differential-amplification time can be set in response to each operation mode of the refresh operation, the read operation, and the write operation. While the differential-amplification time suitable for each of the operations is set, unnecessary time can be eliminated. While the respective operations can be executed by the proper differential-amplification time every operation mode, the high-speed operations can be realized.

Also, since the differential-amplification time during the read operation can be shortened, as compared with the differential-amplification time during the write operation, the unnecessary time can be eliminated and the operation time can be shortened during the read operation, so that the high-speed operation can be realized. Furthermore, both the data-occupation rate and the data-transfer rate on the data bus can be improved in response to both the write operation and the read operation.

In this case, when it is so set that the differential amplification is accomplished at a time instant when the voltages of the bit line pairs (BL0 and /BL0) and (BL1 and /BL1) reach either the voltage to be stored in the memory cells "Ta" to "Td" or a constant voltage higher than, or equal to this voltage, even when the loads are different from each other every operation mode, the proper differential-amplification time can be obtained in the respective operation modes. Since the memory cells are cut out from the bit lines in the proper differential-amplification time every operation mode, the present operation can be advanced to the next operation at the proper timing every operation mode.

If the refresh operation having the shortened differential-amplification time is used, then the refresh operation can be embedded within the external access operations, or the refresh operation can be set between the successive external access operations. As a consequence, the data access method of the present invention can be effectively applied to a so-called "pseudo-SRAM" and a so-termed "pseudo-SSRAM" are realized in a near future, or a semiconductor memory device which requires a new high-speed access operation specification, otherwise another semiconductor memory device in which a high data-occupation rate specification is required in a data bus when a system is constituted.

Next, an embodiment in the case that the present invention is applied to a synchronous type semiconductor memory device such as an SDRAM will now be explained as a fourth embodiment and a fifth embodiment.

Figure 10:
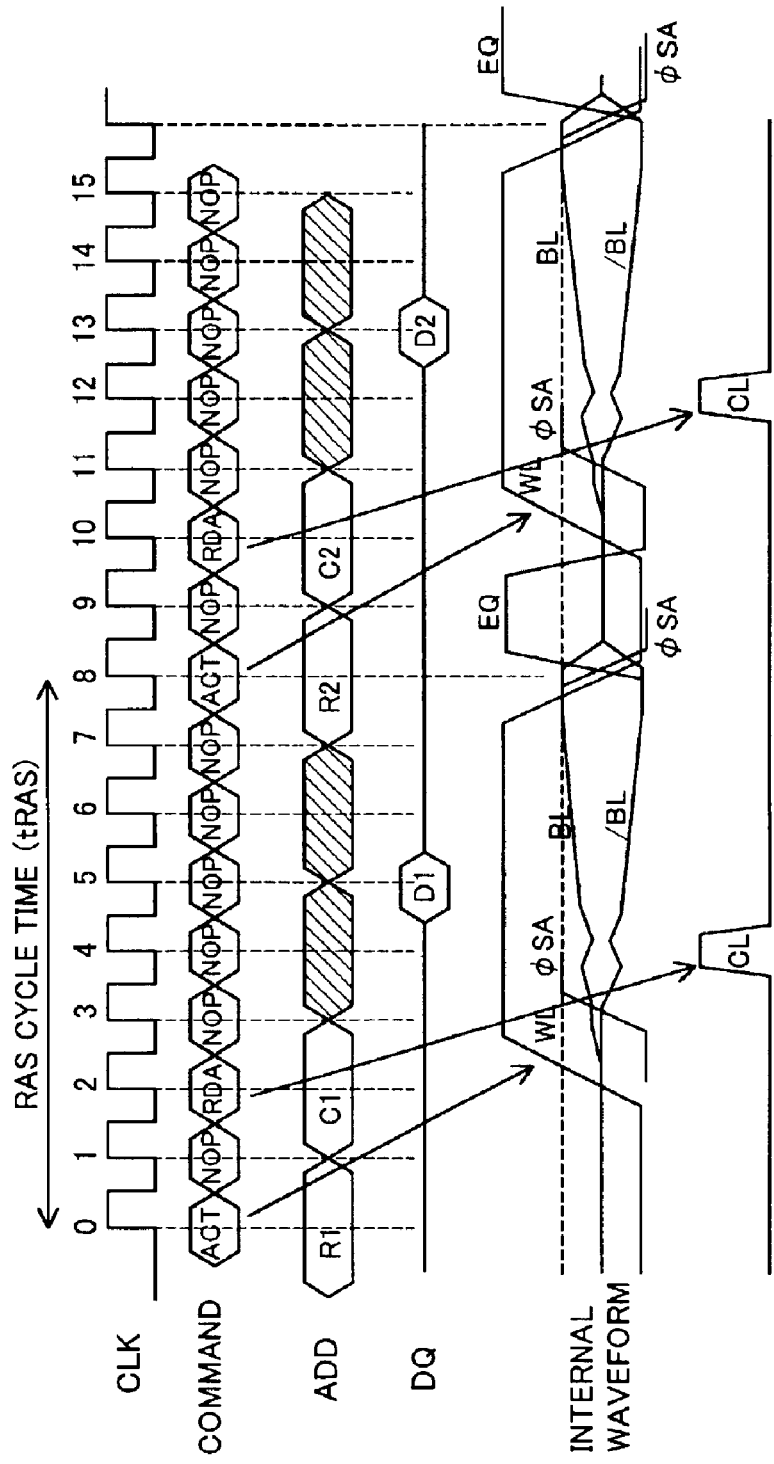
FIG. 10 is a timing chart for indicating operations of a burst length (1) in a synchronous type semiconductor memory device.

The fourth embodiment is accomplished by such a case that a refresh operation is embedded in an operation specification of a burst length "1." First, FIG. 10 indicates a timing chart of the burst length "1" in the normal synchronous type semiconductor memory device. That is, FIG. 10 is a timing chart for indicating such a case that a read operation (operable by RDA command) in combination with an auto-precharge operation is carried out by a CAS latency 3. An RAS cycle time (tRAS) is operated by 8 clocks. After two clocks from an active command ACT, a word line WL is activated, and electron charges of a memory cell are read out to bit line pairs (BL and /BL). Further, after predetermined timing, a sense amplifier activating signal φSA is activated, and the bit line pair (BL and /BL) is differential-amplified. At a time instant (namely, time instant of clock CLK4 in FIG. 10) when the voltage of the bit line pair (BL and /BL) is amplified up to a predetermined voltage level, the column switch signal CL is activated, so that data is read out (at time instant of clock CLK5) to the data lines DB and /DB and outputted as the data D1. Although the bit line pair (BL and /BL) is disturbed, since the differential-amplifying operation is continued, the amplifying operation is continued, so that the voltage level is enlarged. At 5 clocks (namely, time instant of clock CLK8) from the sense amplifier activating signal φSA, the voltage level is amplified up to a predetermined voltage level at which the data can be rewritten into the memory cell. The time duration up to this time instant corresponds to an RAS cycle time (tRAS), and requires 8 clocks. At this timing, the active command ACT is inputted, so that the next burst operation is carried out. The equalization of the bit line pair (BL and /BL) is carried out between the active command ACT and the activation of the word line WL. In the case that the above-described burst operation is continued, the refresh operation is not carried out. In the case that the refresh operation is required, the burst operation is required to be interrupted.

Figure 11:
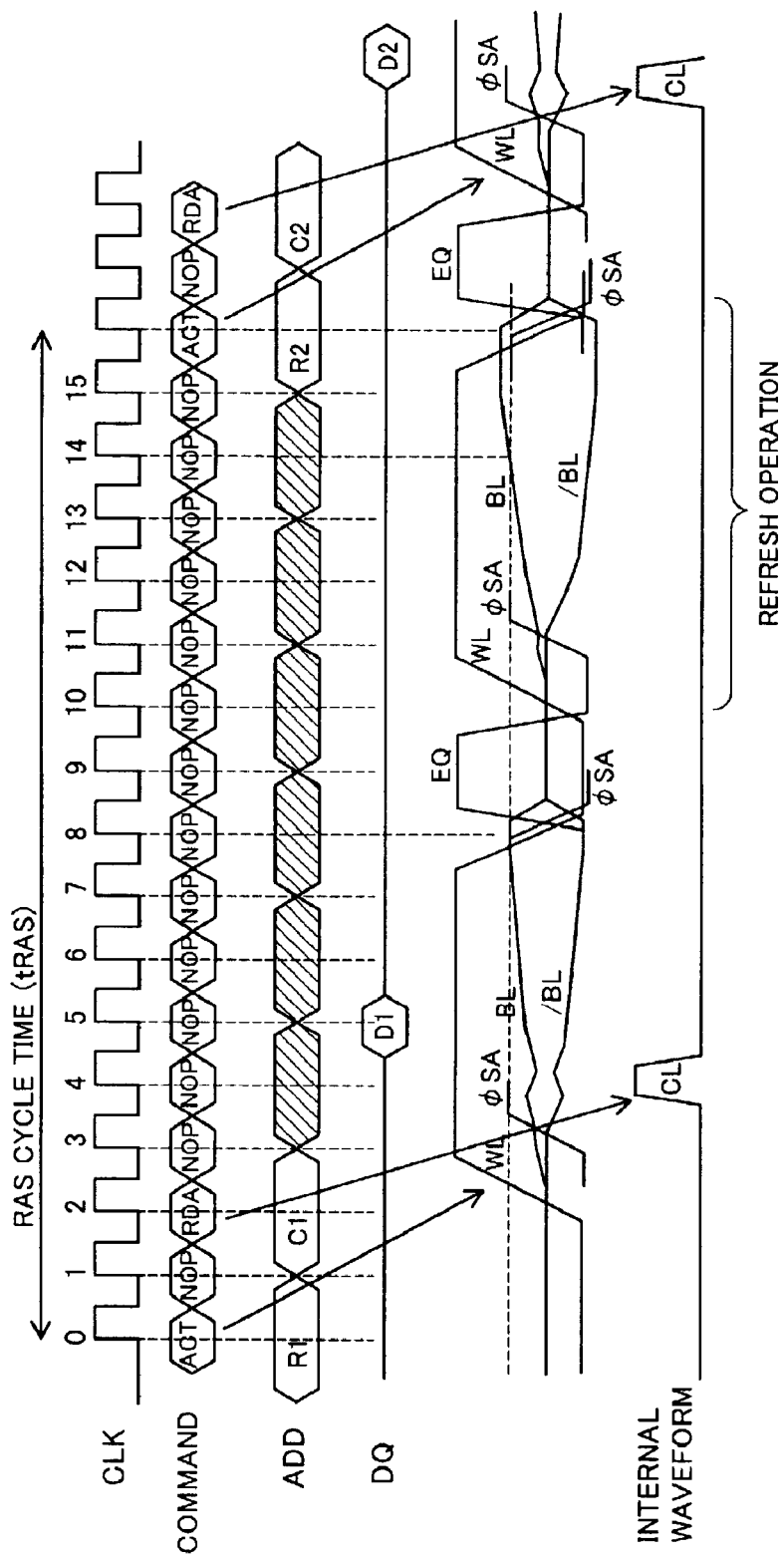
FIG. 11 is a timing chart for showing such a case that a refresh operation is embedded in the operations of the burst length (1) (fourth embodiment)

FIG. 11 shows another technical operation specification in which since a refresh operation is embedded into a burst operation, a refresh operation may also be carried out without interrupting the burst operation. Similar to the above-described case shown in FIG. 10, this technical operation specification corresponds to such a case that a read operation (operable by RDA command) is carried out in connection with a precharge operation by a CAS latency 3. In order to embed the refresh operation, an RAS cycle time (tRAS) is selected to be 16 clocks. As a consequence, after the equalizing operation of the bit line pair (BL and /BL) which has been differential-amplified by the normal read operation, different word lines WL are activated, so that the refresh operation can be embedded in the burst operation On the other hand, in the semiconductor memory device of the prior art, since the differential amplification time when the refresh operation is performed is fixed to the differential amplification when the inverted data is written, the bit line pair (BL and /BL) would be amplified up to the voltage level higher than, or equal to the restore voltage to the memory cell. In other words, such a time duration corresponds to unnecessary time, during which the bit line pair (BL and /BL) is amplified at such a voltage level higher than, or equal to the amplification level (namely, restore level to memory cell) which is required in the refresh operation. This unnecessary time is equal to two clock time defined between a clock 14 and another clock 15.

Under such a circumstance, if the present invention is applied to the refresh operation as the fourth embodiment, then the differential amplification time when the refresh operation is carried out can be optimized as such shortened time that this differential amplification time is shortened by, for instance, two clocks. As a result, the RAS cycle time (tRAS) can be shortened. Concretely speaking, in FIG. 11, in the case of the burst length "1" in the normal semiconductor memory device, the refresh operation is embedded by tRAS=16 clocks, whereas if the present invention is applied, then the refresh operation can be embedded by tRAS=14 clocks.

As a consequence, since the differential amplification time in the refresh operation can be shortened, the refresh operation can be embedded in a higher efficiency within the time period of the external access operation of the burst length 1. While the operation time period which is exclusively used for the refresh operation is not set, the occupation rate of the external access operation within the burst operation of the burst length 1 can be increased, and also, both the data-occupation rate and the data-transfer rate on the data bus can be improved.

Figure 12:
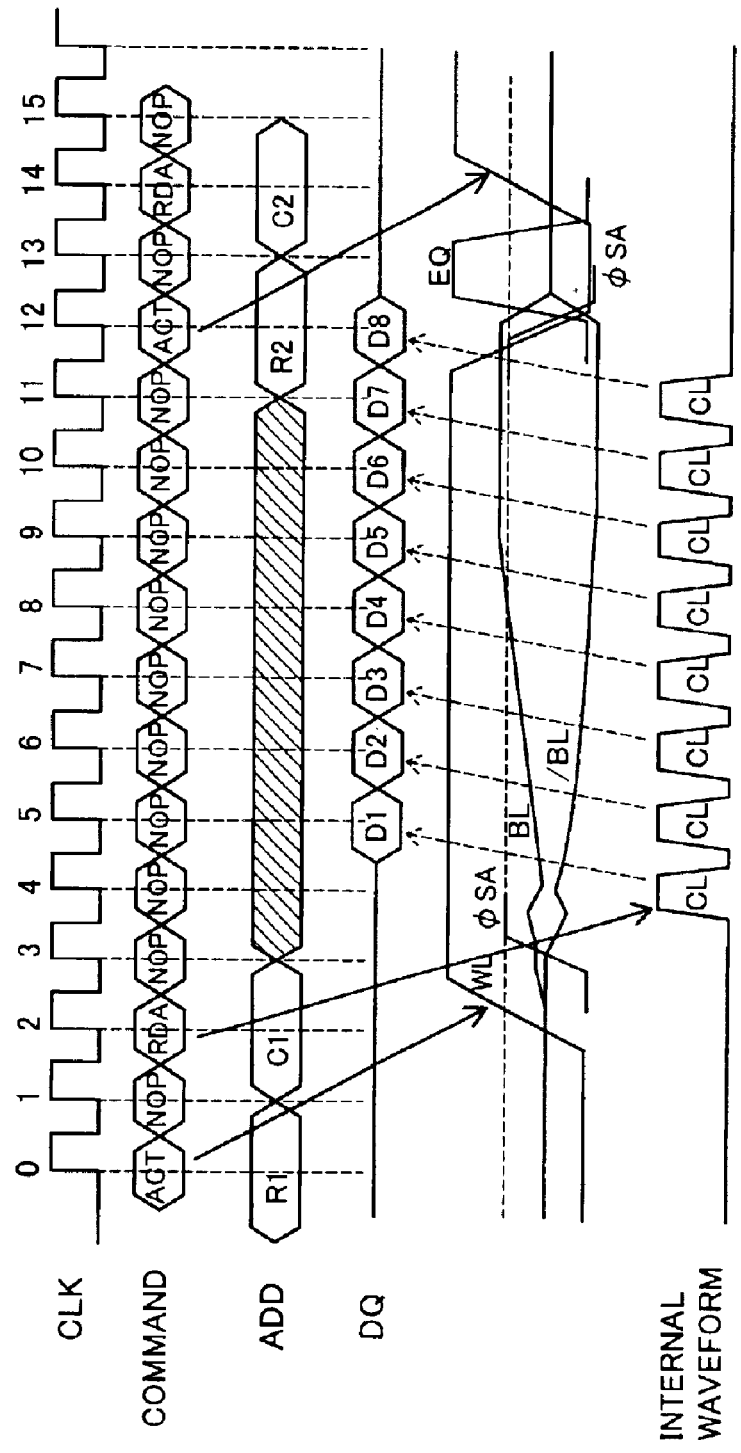
FIG. 12 is a timing chart for indicating operations of multiple burst length (8) in a synchronous type semiconductor memory device.

Next, a fifth embodiment of the present invention is such a case that a refresh operation is embedded in an operation specification of a multiple burst length. First, as the operation executed in the normal synchronous type semiconductor memory device, a timing chart of a burst length "8" is shown in FIG. 12. Similar to the above-explained case of FIG. 10, FIG. 12 represents a timing chart in the case that a read operation (operable by RDA command) is carried out in connection with an auto-precharge operation by a CAS latency 3. Since a basic operation of this FIG. 12 is similar to that of FIG. 10, explanations thereof are omitted.

In the timing chart of FIG. 12, 8(eight) pieces of data D1 to D8 are outputted in synchronism with a clock CLK in response to a single RDA command (namely, operation of burst length "8"). In FIG. 12, waveforms of a bit line pair (BL and /BL) are typically represented as those with respect to the data D1. As a consequence, timing at which a disturb phenomenon is received is defined only for a first column switch signal CL. Although not shown in this drawing, bit line pairs (BL and /BL) different from each other receives a disturb phenomenon with respect to the second to eighth column switch signals CL. Assuming now that the first to eighth column switch signals CL are given at the same addresses, the bit line pair (BL and /BL) receives the disturb phenomenon every time in synchronism with the column switch signal CL. In FIG. 12, as the operation of this burst length "8", tRAS=12 clocks are required. Also, since one clock per one data is required, in the case that a burst length is longer than, or equal to 9, the resulting tRAS is given by adding 1 clock per 1 data. For instance, considering now that a burst length is equal to 16, tRAS=12 clocks+8 clocks=20 clocks. Also, in this case, no refresh operation is carried out during the burst operation, and if the refresh operation is required, then the burst operation must be interrupted.

Figure 13:
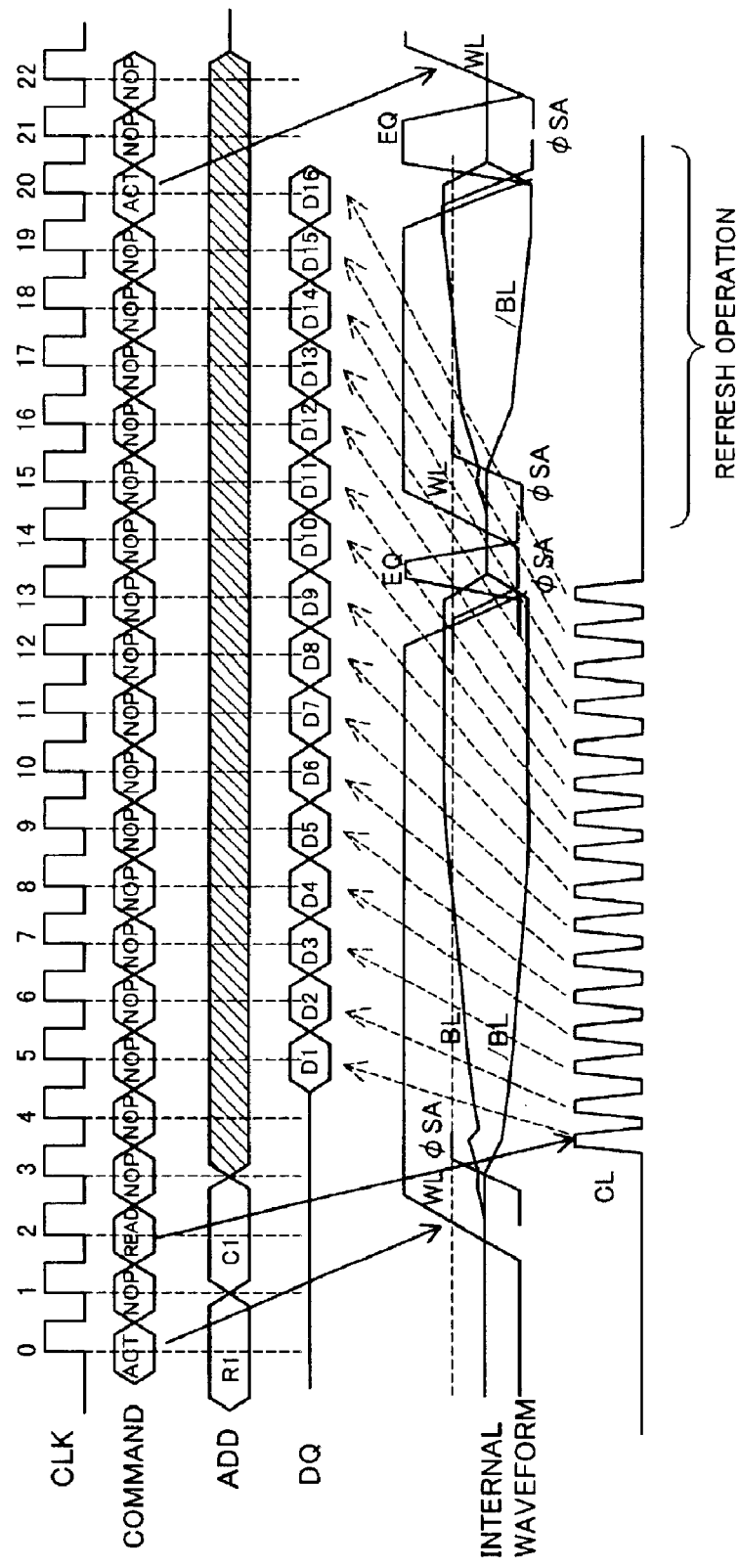
FIG. 13 is a timing chart for showing such a case that a refresh operation is embedded in the operations of the multiple burst length (8) (fifth embodiment)
Figure 14:
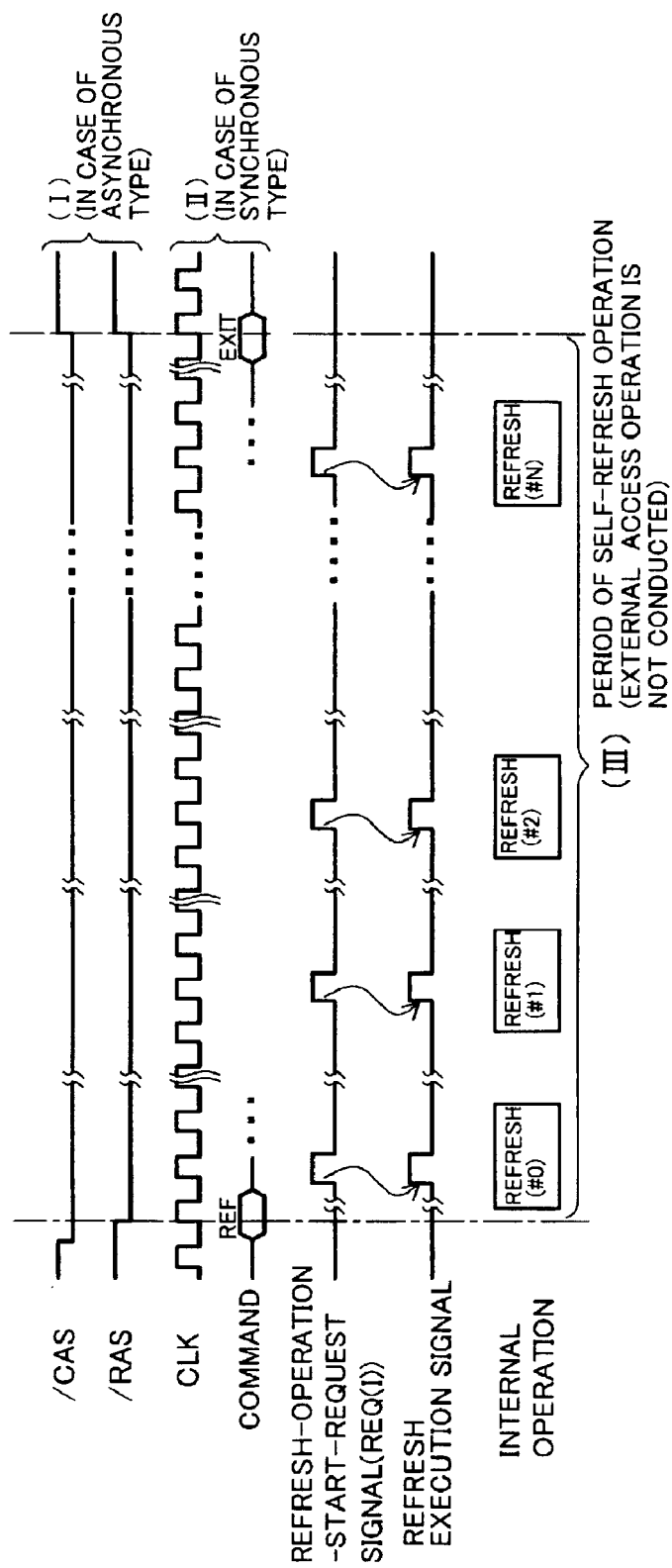
FIG. 14 is a timing chart for indicating the external control refresh operation of the prior art.
Figure 15:
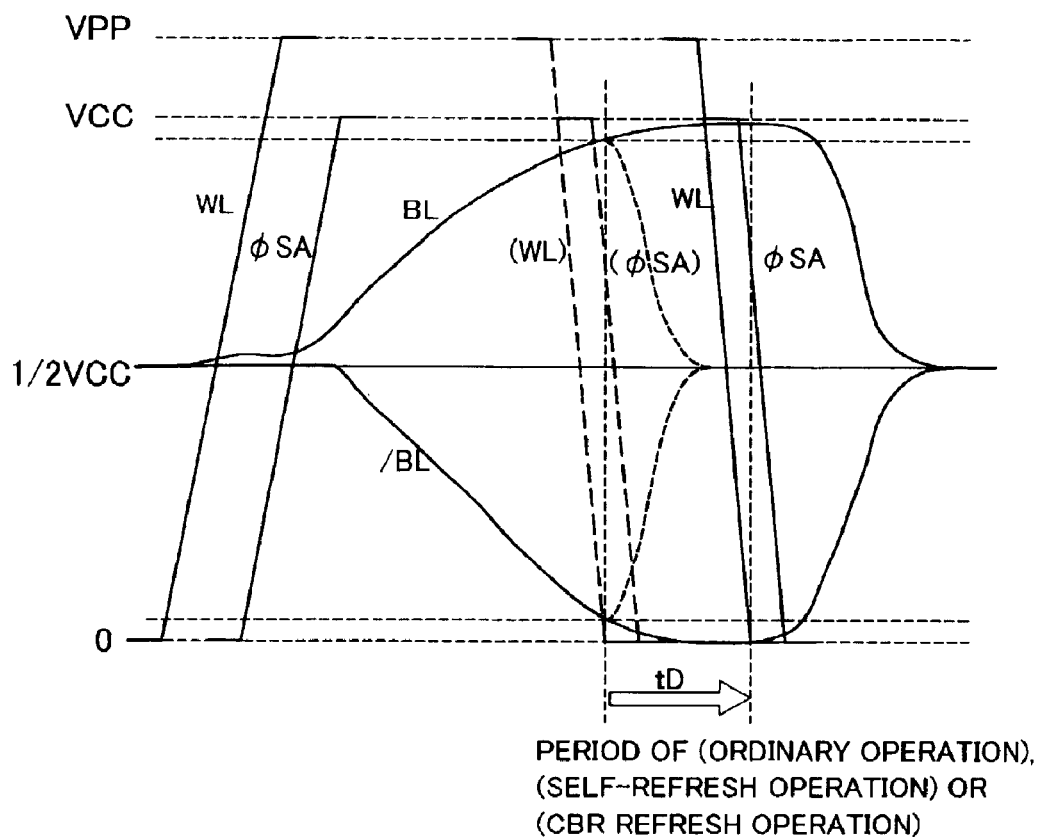
FIG. 15 is a waveform diagram for representing the extension of the cycle time in the refresh operation of the prior art.

FIG. 13 represents a technical operation specification in which a refresh operation may also be carried out without interrupting a burst operation by embedding the refresh operation within multiple burst operation in the case of operations of the multiple burst length. Similar to the operation specification of FIG. 12, this technical operation specification corresponds to such a case that a read operation is carried out by an RDA command by a CAS lengthy 3. In FIG. 13, a column switch signal CL by which data is read out from the bit line pair (BL and /BL) to the data lines DB and /DB is not synchronized with a clock CLK, but is operable in a faster time period than that of this clock CLK. In other words, data is read out to the data lines DB and /DB prior to the timing of this clock CLK. While the precedently-read data is held in a temporary holding circuit such as a data buffer circuit, this data is outputted outside this semiconductor memory device in synchronism with such a clock CLK corresponding to subsequent read timing.

Since the data is precedently read out, the bit line pair (BL and /BL) which is differential-amplified so as to read data can be equalized at faster timing, as compared with the external technical specification. In FIG. 13, if the semiconductor memory device is used under the normal operation, then the differential amplification condition must be maintained up to a clock CLK 20 corresponding to end timing of tRAS. As a result of the precedently-reading operation, the present operation can be advanced to an equalization operation by receiving a clock CLK 13.

As a result, in the case of such a technical operation specification defined by tRAS=20 clocks, a time domain equal to 7 clocks (namely, clock CLK 13 to clock CLK 19) is opened, during which a refresh operation can be embedded.

In this case, as the fifth embodiment, if the present invention is applied to the refresh operation, then the differential amplification time during the refresh operation can be optimized as, for example, such a differential amplification time shortened by 2 clocks. As a result, the RAS cycle time (tRAS) can be shortened. Concretely speaking, in FIG. 13, in the case of the burst length "16", the refresh operation is embedded at tRAS=20 clocks, whereas if the present invention is applied, then the refresh operation can be embedded at tRAS=18 clocks.

As a result, since the differential amplification time during the refresh operation can be shortened, the refresh operation can be embedded in a higher efficiency during the external access operation duration of the multiple burst length. While the operation time period which is exclusively used for the refresh operation is not set, the occupation rate of the external access operation within the burst operation of the multiple burst length can be increased, and also, both the data occupation rate and the data-transfer rate on the data bus can be improved.

Also, in accordance with the fourth and fifth embodiments, in addition to such a fact that the differential amplification time of the bit line pair is shortened during the refresh operation, as compared with the differential amplification time of the bit line pair during the external access operation, if the differential amplification time of the bit line pair during the write operation is set to be longer than the differential amplification time of the bit line pair during the read operation within the external access operation, then the operation time can be properly compressed, or reduced every operation mode in the external access operation. Further, the refresh operation can be embedded into the compressed external access operation time period. The external access operation can be carried out in a high speed, and both the data-occupation rate and the data-transfer rate on the data bus can be improved.

In this case, the differential amplification time is preferably defined by such a time which is commenced from either the external access operation or the refresh operation, after the voltage of the bit line pair has reached a preselected voltage. As a result, if this preselected voltage is equal to a voltage when data is stored in a memory cell, then the differential amplification can be accomplished at a time instant when the voltage of the bit line pair reaches a constant voltage higher than, or equal to the preselected voltage every operation mode, the differential amplification time can be properly set with respect to each of the operation modes.

Also, if the execution of the refresh operation is subsequently commenced after the equalization operation of the bit line pair which has been differential-amplified during the external access operation preceding to this refresh operation has been completed, then the refresh operation can be commenced at the earliest timing. The refresh operation can be effectively embedded during the external access operation time period in conjunction with the shortened differential amplification time within the refresh operation. A large number of refresh operations can be embedded during the external access operation time period per unit length.

Also, if the refresh operation is carried out in synchronism with the external access operation, then both the external access operation and the refresh operation can be executed at commonly-synchronized timing, which may achieve better control operation.

Furthermore, in accordance with the fourth and fifth embodiments, if the refresh operation having the shortened differential-amplification time is used, then the refresh operation can be effectively embedded into the external access operation time period during the burst operation. As a consequence, the data access method of the present invention can be effectively applied to a so-called "pseudo-SRAM" and a so-termed "pseudo-SSRAM" are realized in a near future, or a semiconductor memory device which requires a new high-speed access operation specification, otherwise another semiconductor memory device in which a high data-occupation rate specification is required in a data bus when a system is constituted.

It should be understood that the present invention is not limited only to the above-described embodiments, but may be modified, changed, or substituted without departing from the technical scope and spirit of the present invention.

For instance, the normal refresh operation has been described as the internal access operation in this embodiment. However, the present invention is not limited to this example, but may be similarly applied to other operations than the refresh operation if such an internal operation is carried out to drive a light load, as compared with a load during the differential amplification operation of the bit line pair in the external access operation. As a specific example, as to a semiconductor memory device having a hierarchical bit line structure, the present invention may be similarly applied to such a semiconductor memory device having a function in which a bit line pair of a lower hierarchical layer is differential-amplified and a refresh operation is carried out. Also, the present invention may be similarly applied to the following case. That is, as an internal access operation, a data access operation is executed within a semiconductor memory device, or within a semiconductor integrated circuit device containing a semiconductor memory device. That is, such a technical operation specification is mixed with the original technical operation specification, in which a differential amplification with a light load is carried out, as compared with a load of a bit line pair during an external access operation.

In accordance with the present invention, it is possible to provide the data access method of the semiconductor memory device and the semiconductor memory device, operable in that while the refresh operation is executed as the internal access operation which is independently carried out with respect to the external access operation, it is capable of effectively arranging the refresh operation within the external access operation, or between successive external access operations.

What is claimed is:

1. A data access method of a semiconductor memory device performing an external access operation for inputting/outputting data with respect to an external device, and a refresh operation corresponding to an internal access operation which does not perform the data input/output operation with respect to the external device, wherein, as compared with differential amplification time of a bit line pair during the external access operation, differential amplification time of the bit line pair during the refresh operation is made shorter.

2. A data access method of a semiconductor memory device according to claim 1, wherein differential amplification time of a bit line pair in a write operation is made longer than differential amplification time of a bit line pair in a read operation within the external access operation.

3. A data access method of a semiconductor memory device according to claim 1, wherein the differential amplification time is defined from an initiation of either the external access operation or the refresh operation up to such time after a voltage of the bit line pair reaches a predetermined voltage.

4. A data access method of a semiconductor memory device according to claim 1, wherein the differential amplification time is equivalent to a time duration defined after a differential-amplifying operation of a bit line pair is commenced and until a bit line is cut out from a memory cell.

5. A data access method of a semiconductor memory device according to claim 1, wherein the differential amplification time is equivalent to such a time duration defined since an activating signal of a word line, an activating signal of a sense amplifier, or a signal synchronized with the activating signals has been produced, and until the word line is deactivated.

6. A data access method of a semiconductor memory device according to claim 1, wherein the refresh operation is carried out in asynchronous with the external access operation.

7. A data access method of a semiconductor memory device according to claim 1, wherein in the case that the external access operation is in competition with the refresh operation, the data access method owns an arbitration function by which any one of the external access/refresh operations is executed at a top priority, and the other operation is again operated at predetermined timing after the precedently-executed operation has been accomplished.

8. A data access method of a semiconductor memory device according to claim 7, wherein the predetermined timing corresponds to the shortest timing subsequent to the completion of the precedently-executed operation.

9. A data access method of a semiconductor memory device according to claim 7, wherein the completion of the precedently-executed operation is made coincident with such timing at which an equalization operation of the bit line pair which is differentially amplified is completed.

10. A data access method of a semiconductor memory device according to claim 1, wherein the refresh operation is automatically initiated based upon an internal control of the semiconductor memory device.

11. A data access method of a semiconductor memory device performing an external access operation for inputting/outputting data with respect to an external device, and a refresh operation corresponding to an internal access operation which is automatically initiated during a time period of the external access operation, wherein as compared with differential amplification time of a bit line pair during the external access operation, differential amplification time of the bit line pair during the refresh operation is made shorter.

12. A data access method of a semiconductor memory device according to claim 11, wherein differential amplification time of a bit line pair in a write operation is made longer than differential amplification time of a bit line pair in a read operation within the external access operation.

13. A data access method of a semiconductor memory device according to claim 11, wherein the differential amplification time is defined from an initiation of either the external access operation or the refresh operation up to such time after a voltage of the bit line pair reaches a predetermined voltage.

14. A data access method of a semiconductor memory device according to claim 11, wherein the execution of the refresh operation is subsequently commenced after an equalization operation of the bit line pair is accomplished which has been differential-amplified in the external access operation which is precedently executed.

15. A data access method of a semiconductor memory device according to claim 11, wherein the refresh operation is carried out in synchronism with the external access operation.

16. A semiconductor memory device having an external access operation for inputting/outputting data with respect to an external device, and a refresh operation which does not perform the data input/output operation with respect to the external device, comprising:

a first timer section for measuring first time as differential amplification time of a bit line pair based upon an external-access-operation-start-request signal; and a second timer section for measuring second time as differential amplification time of a bit line pair based upon a refresh-operation-start-request signal, the second time being shorter than the first time.

17. A semiconductor memory device according to claim 16, wherein the first timer section is comprised of:

a read timer section for measuring read-amplification time as the differential amplification time of the bit line pair in the case that the external access operation is a read operation; and a write timer section for measuring write-amplification time as the differential amplification time of the bit line pair in the case that the external access operation is a write operation, the write-amplification time being longer than the read-amplification time.

18. A semiconductor memory device according to claim 17 wherein, the semiconductor memory device is further comprised of:

a first auxiliary timer section for measuring an increased portion of the write-amplification time with respect to the read-amplification time; and wherein the write timer section includes the read timer section and the first auxiliary timer section.

19. A semiconductor memory device according to claim 16 further including at least either one of (1) and (2), namely: (1) a second auxiliary timer section; and (2) a set of an auxiliary-read timer section and an auxiliary-write timer section; both (1) and (2) for measuring an increased portion with respect to the second time;

wherein at least either one of (3) and (4), namely, (3) the first timer section, and (4) a set of the read-timer section and the write-timer section, is constituted by containing (5) or (6), namely: (5) a set of the second timer section and the second auxiliary timer section; or (6) at least either one of the second timer section and the set of the auxiliary-read timer section and the auxiliary-write timer section.

20. A semiconductor memory device according to claim 16, wherein the differential amplification time is measured under such a condition that an activating signal of a word line, an activating signal of a sense amplifier, or a signal which is synchronized with the activating signals is used as a starting point.

21. A semiconductor memory device according to claim 16, wherein the word line is deactivated based upon either an output signal of the first timer section or an output signal of the second timer section.

22. A semiconductor memory device according to claim 16, wherein the refresh operation is carried out in asynchronous with the external access operation.

23. A semiconductor memory device according to claim 22, wherein in the case that the external access operation is in competition with the refresh operation, data access method owns an arbitration function by which any one of the external access/refresh operations is executed at a top priority, and the other operation is again operated at predetermined timing after precedently-executed operation has been accomplished.

* * * * *